United States Patent
Tanaka et al.

(10) Patent No.: US 12,424,457 B2
(45) Date of Patent: Sep. 23, 2025

(54) SEMICONDUCTOR DEVICE MANUFACTURING METHOD

(71) Applicant: FUJI ELECTRIC CO., LTD., Kawasaki (JP)

(72) Inventors: Masanori Tanaka, Matsumoto (JP); Akira Furuta, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 744 days.

(21) Appl. No.: 17/848,702

(22) Filed: Jun. 24, 2022

(65) Prior Publication Data
US 2023/0050112 A1 Feb. 16, 2023

(30) Foreign Application Priority Data
Aug. 11, 2021 (JP) .................. 2021-131404

(51) Int. Cl.
*H01L 21/56* (2006.01)
*H01L 21/48* (2006.01)
*H01L 23/31* (2006.01)
*H01L 23/495* (2006.01)

(52) U.S. Cl.
CPC ........ *H01L 21/565* (2013.01); *H01L 21/4825* (2013.01); *H01L 23/3107* (2013.01); *H01L 23/49506* (2013.01); *H01L 23/4952* (2013.01); *H01L 23/49575* (2013.01)

(58) Field of Classification Search
CPC ................. H01L 21/563; H01L 21/565; H01L 2224/48137; H01L 23/4334; H01L 2924/182; H01L 2924/1815; H01L 2924/1816; H01L 2924/18165; H01L 23/3121
See application file for complete search history.

(56) References Cited

U.S. PATENT DOCUMENTS 6,002,166 A * 12/1999 Noda ................ H01L 23/49575
257/691
2001/0020734 A1 9/2001 Inaba
(Continued)

FOREIGN PATENT DOCUMENTS

EP 0910121 A1 4/1999
EP 0911874 A2 4/1999
(Continued)

OTHER PUBLICATIONS

Jp2000003923 translation (Year: 2000).*
Japanese Office Action dated Jun. 10, 2025, in the counterpart Japanese Patent Application No. 2021-131404.

*Primary Examiner* — Raj R Gupta
(74) *Attorney, Agent, or Firm* — Rabin & Berdo, P.C.

(57) ABSTRACT

A semiconductor device manufacturing method includes a molding step including disposing a control pin between an inlet and a control wire and on a line connecting the inlet and the control wire in a plan view of the semiconductor device, injecting molding resin raw material into a cavity through the inlet, filling the cavity with the molding resin raw material, and sealing a semiconductor chip and a control element disposed on a main current lead frame and a control lead frame. In this way, the flow velocity of the molding resin raw material flowing to the control wire is reduced.

16 Claims, 20 Drawing Sheets

(56) References Cited

U.S. PATENT DOCUMENTS

| | | | |
|---|---|---|---|
| 2005/0082690 A1* | 4/2005 | Hayashi | .................. H01L 24/49 |
| | | | 257/E23.092 |
| 2014/0312514 A1 | 10/2014 | Yasunaga et al. | |
| 2017/0294369 A1* | 10/2017 | Kawashima | ...... H01L 23/49558 |
| 2021/0066258 A1* | 3/2021 | Denta | ............... H01L 23/49568 |

FOREIGN PATENT DOCUMENTS

| | | | |
|---|---|---|---|
| JP | H03-60146 A | | 3/1991 |
| JP | H11-126861 A | | 5/1999 |
| JP | H11-177011 A | | 7/1999 |
| JP | 2000003923 A | * | 1/2000 |
| JP | 2001-196532 A | | 7/2001 |
| JP | 2005-116556 A | | 4/2005 |
| JP | 2005-123495 A | | 5/2005 |
| JP | 2013118353 A | | 6/2013 |
| WO | 98/24122 A1 | | 6/1998 |
| WO | 2016/072012 A1 | | 5/2016 |

* cited by examiner

SEMICONDUCTOR DEVICE MANUFACTURING METHOD

CROSS-REFERENCE TO RELATED APPLICATION

This application is based upon and claims the benefit of priority of the prior Japanese Patent Application No. 2021-131404, filed on Aug. 11, 2021, the entire contents of which are incorporated herein by reference.

BACKGROUND OF THE INVENTION

1. Field of the Invention

The embodiments discussed herein relate to a semiconductor device manufacturing method.

2. Background of the Related Art

A semiconductor device includes semiconductor chips, control integrated circuits (ICs), main current lead frames including main die pad portions on which the semiconductor chips are disposed, and control lead frames including control die pad portions on which the control ICs are disposed. The semiconductor chips are directly connected to their respective main current lead frames via wires, and the control IC are directly connected to their respective control lead frames via wires. In addition, the control ICs are directly connected to the control electrodes of their respective semiconductor chips via wires. In addition, the semiconductor chips, the control ICs, the main die pad portions, and the control die pad portions of the semiconductor device are sealed by sealing material. The semiconductor chips include, as power devices, switching elements and diode elements. Examples of the switching elements include insulated gate bipolar transistors (IGBTs) and power metal-oxide-semiconductor field-effect transistors (MOSFETs). The diode elements are free wheeling diodes (FWD) such as Schottky barrier diodes (SBDs) and P-intrinsic-N (PiN) diodes. The control ICs control the driving of the switching elements by outputting control signals via the wires.

The semiconductor device as described above is manufactured through the following steps. First, the semiconductor chips are disposed on the main die pad portions, and the control ICs are disposed on the control die pad portions. Next, the main current lead frames including the main die pad portions and the control lead frames including the control die pad portions are disposed in a cavity of a mold. Next, liquid sealing resin is injected into the mold to seal the mold, and the sealing resin is cured. The semiconductor device is obtained by removing the mold (see, for example, Japanese Laid-open Patent Publication No. 2005-123495).

In accordance with the above semiconductor device manufacturing method, when the liquid sealing resin (molding resin raw material) is injected into the cavity, the sealing resin fills the cavity while flowing inside the cavity. In the process of this filling, the sealing resin flowing in the cavity could deform wires. In some cases, the sealing resin could knock down wires. If a wire is deformed, this wire could come into contact with its neighboring wire, resulting in a short circuit. In addition, if a wire is knocked down, a bonding portion of the wire could be peeled off. Any of these leads to a malfunction of the semiconductor device, whereby the reliability of the semiconductor device is deteriorated.

SUMMARY OF THE INVENTION

In one aspect of the embodiments, there is provided a semiconductor device manufacturing method including: preparing a molding resin raw material, a mold having a rectangular shape in a plan view of the semiconductor device and including a storage space surrounded by a first long side, a first short side, a second long side, and a second short side in this order and an inlet for the molding resin raw material to be injected into the mold along the first long side or the second short side, a lead frame including a main die pad, a main current terminal integrally connected to the main die pad and extending in a first direction toward the first long side, a first control die pad disposed closer to the second long side than is the main die pad, a control terminal integrally connected to the first control die pad and extending in a second direction opposite to the first direction toward the second long side, and a second control die pad disposed closer to the second long side than is the first control die pad, a semiconductor chip including a control electrode on a front surface thereof, and a control element having a first front surface electrode on a front surface thereof; mounting the semiconductor chip on the main die pad and the control element on the first control die pad; connecting by wire the control electrode of the semiconductor chip to the first front surface electrode of the control element and/or the control terminal of the lead frame to the first front surface electrode of the control element; after the mounting and before or after the connecting by wire, placing the lead frame in the mold such that the semiconductor chip and the control element are stored in the storage space; and sealing the semiconductor chip and the control element on the lead frame with the molding resin raw material by disposing a control pin between the inlet and the wire and on a line connecting the inlet and the wire in the plan view, injecting the molding resin raw material from the inlet into the storage space, a flow of the molding resin raw material being controlled by the control pin, and filling the storage space with the molding resin raw material.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device 10 in the following drawings, terms "front surface" and "top surface" each mean an upward surface. Likewise, regarding the semiconductor device 10 in the following drawings, a term "up" means an upward direction. In addition, regarding the semiconductor device 10 in the following drawings, terms "rear surface" and "bottom surface" each mean a downward surface. Likewise, regarding the semiconductor device 10 in the following drawings, a term "down" means a downward direction. In the other drawings, too, the above terms mean their respective directions, as needed. The terms "front surface", "top surface", "up", "rear surface", "bottom surface", "down", and "side surface" are only expressions used for the purpose of convenience to determine relative positional relationships and do not limit the technical concept of the embodiments. For example, the terms "up" and "down" may mean directions other than the vertical directions with respect to the ground. That is, the directions expressed by "up" and "down" are not limited to the directions relating to the gravitational force. In the following description, when a component contained in material represents 80 vol % or more of the material, this component will be referred to as the "main component" of the material.

First Embodiment

Figure 1A:
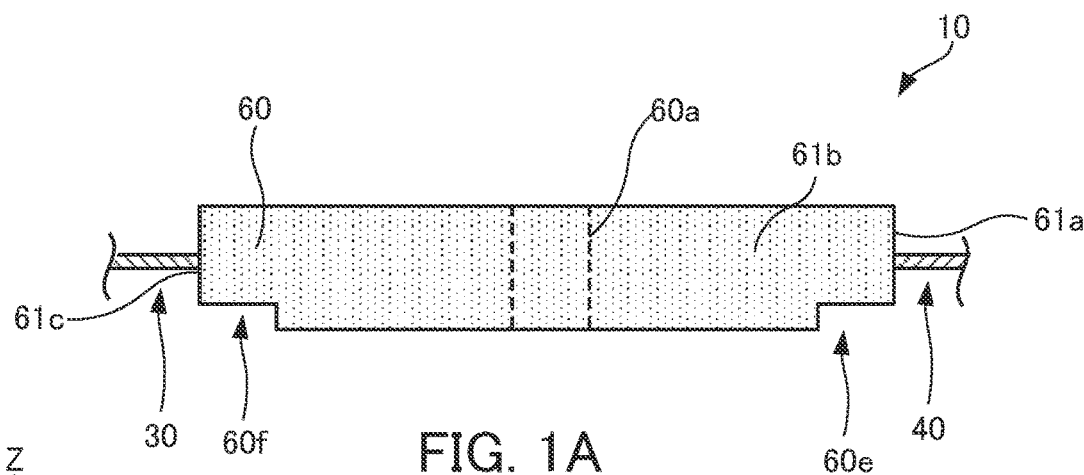
FIGS. 1A and 1B are external views of a semiconductor device according to a first embodiment.
Figure 1B:
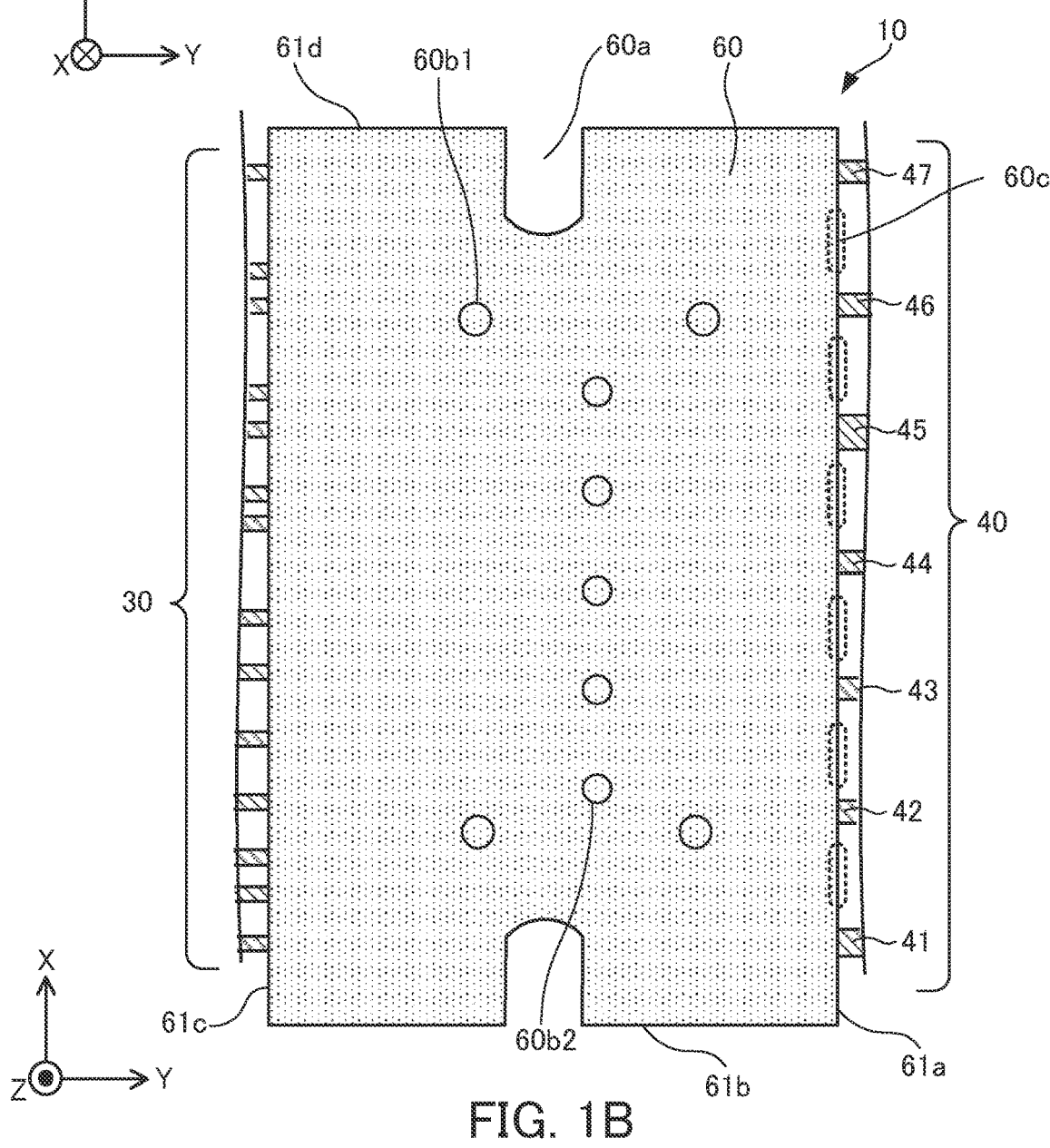
Figure 2:
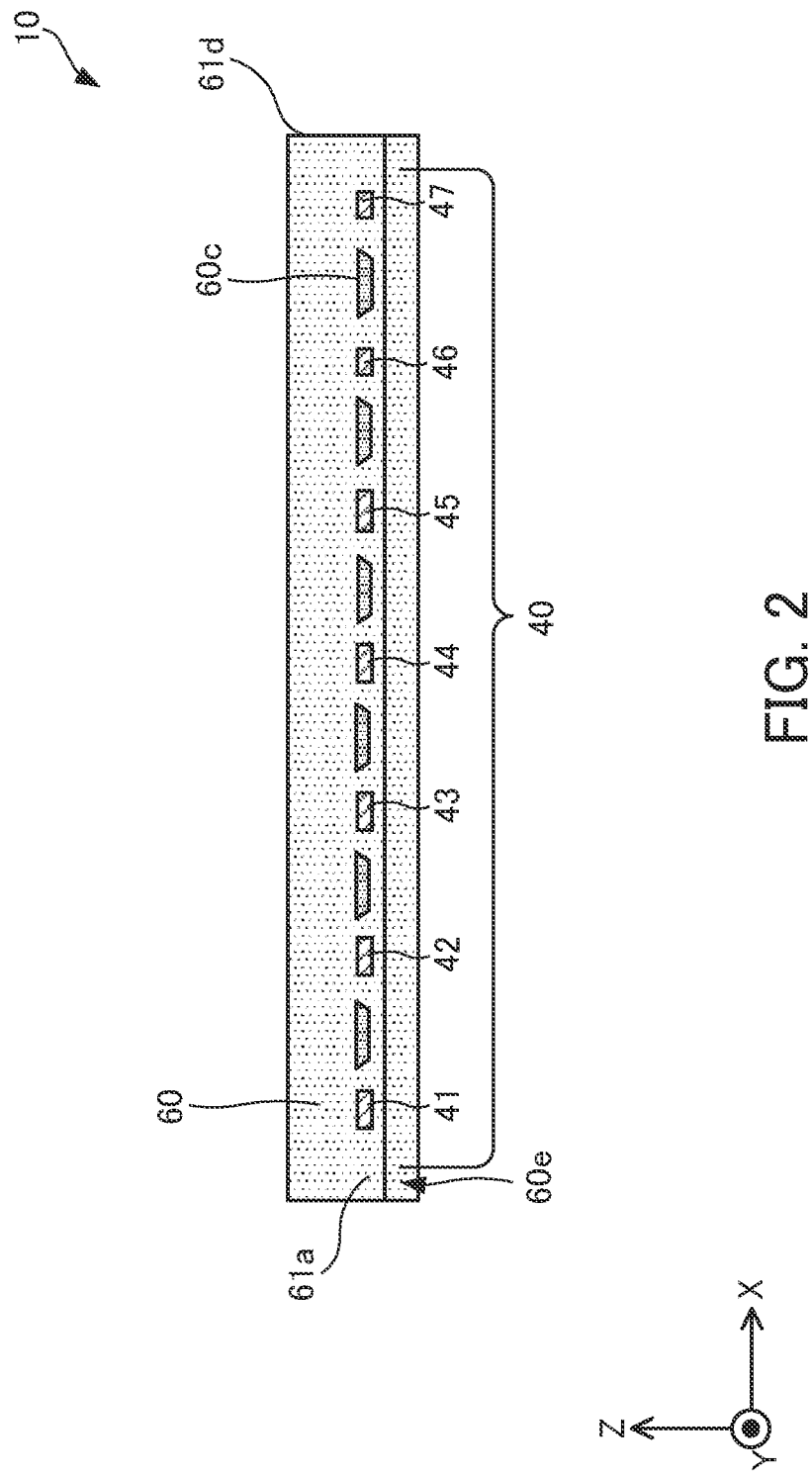
FIG. 2 is a side view of the semiconductor device according to the first embodiment.
Figure 3:
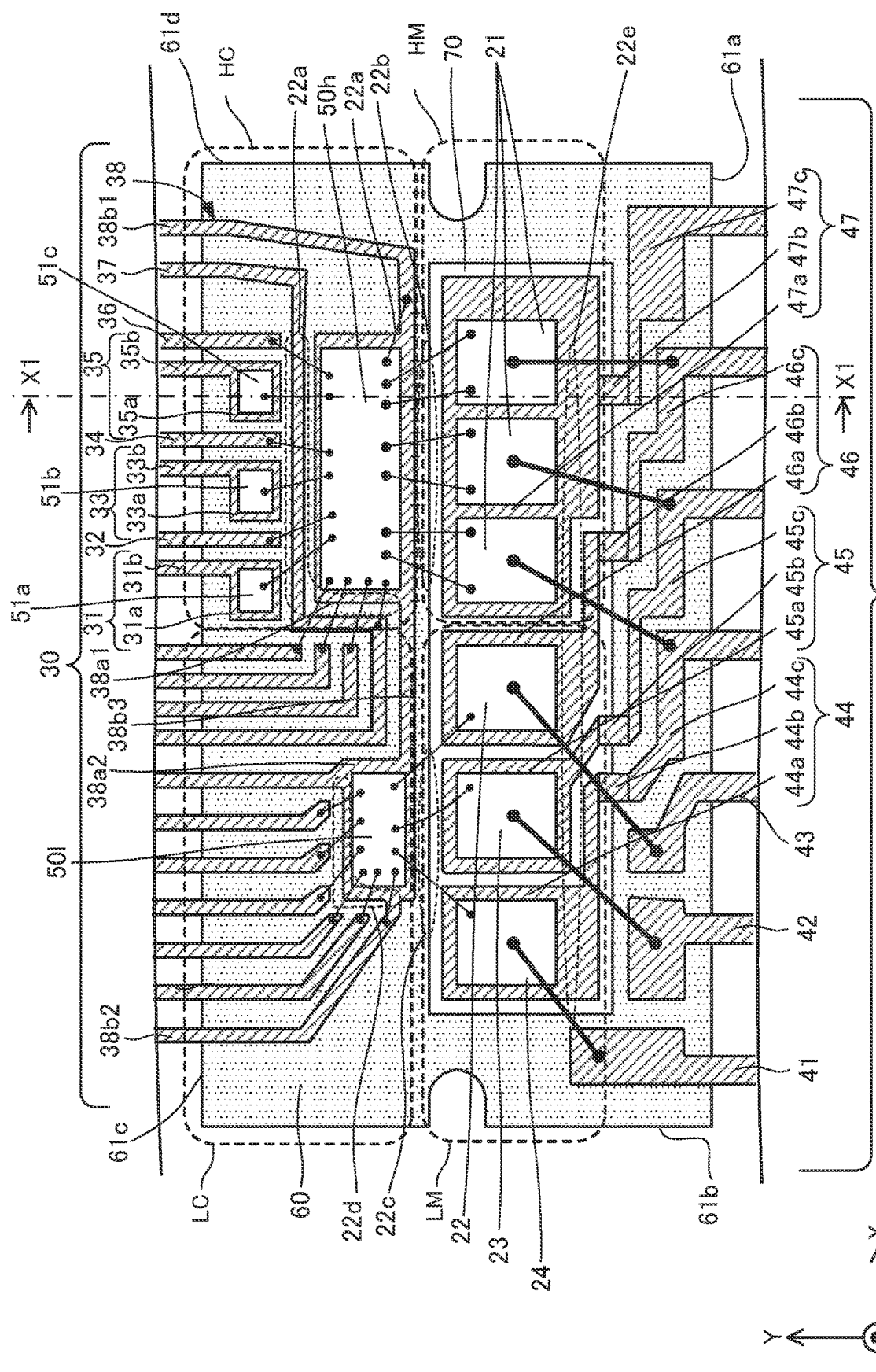
FIG. 3 is a plan view of the semiconductor device according to the first embodiment.
Figure 4:
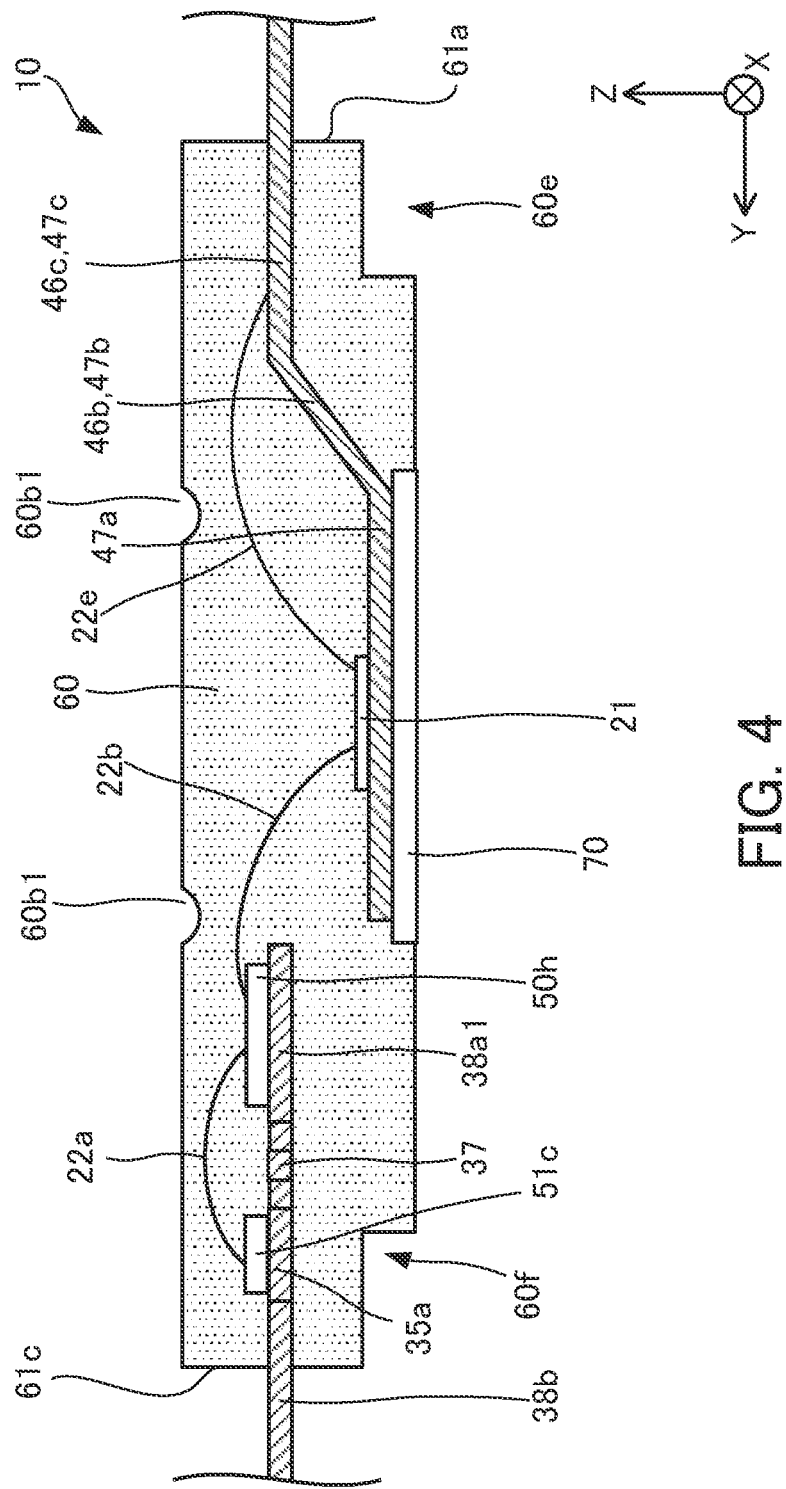
FIG. 4 is a sectional view of the semiconductor device according to the first embodiment.

The semiconductor device 10 according to a first embodiment will be described with reference to FIGS. 1 to 4. FIGS. 1A and 1B are external views of the semiconductor device 10 according to the first embodiment, and FIG. 2 is a side view of the semiconductor device according to the first embodiment. FIG. 1A illustrates a side surface of the semiconductor device 10 in FIG. 1B seen in the X direction. FIG. 1B illustrates the front surface of the semiconductor device 10. FIG. 2 is a side surface of the semiconductor device 10 in FIG. 1B seen in the −Y direction. FIG. 3 is a plan view of the semiconductor device 10 according to the first embodiment, and FIG. 4 is a sectional view of the semiconductor device 10 according to the first embodiment. FIG. 3 illustrates arrangement of internal components of the semiconductor device 10 seen from its front surface. FIG. 4 is a sectional view taken along a dashed-dotted line X1-X1 in FIG. 3 and illustrates components disposed in the X direction from the dashed-dotted line X1-X1.

First, as illustrated in FIGS. 1A and 1B, overall components of the semiconductor device 10 are sealed by molding resin 60, and thus, the semiconductor device 10 has a cuboid shape. While the molding resin 60 of the semiconductor device 10 has a cuboid shape, corners of the molding resin 60 may each have a curvature. In addition, the molding resin 60 has a rectangular shape in plan view and has a pair of long sides 61a and 61c opposite to each other and a pair of short sides 61b and 61d opposite to each other. That is, the molding resin 60 has one long side denoted by 61a, one short side denoted by 61b, the other long side denoted by 61c, and the other short side denoted by 61d in this order. The semiconductor device 10 has its front surface covered by the molding resin 60, and the rear surface of an insulating sheet 70 is exposed to the outside from the rear surface of the molding resin 60 (these rear surfaces are not illustrated in FIG. 1B). In addition, the rear surface of the insulating sheet 70 and the rear surface of the molding resin 60 form the same plane. The semiconductor device 10 includes a plurality of control lead frames 30 on the long side 61c of the molding resin 60 and a plurality of main current lead frames 40 on the long side 61a of the molding resin 60. The control lead frames 30 extend perpendicularly to the long side 61c, and the main current lead frames 40 extend perpendicularly to the long side 61a. In FIG. 1B, main current lead frames 41 to 47 are formed at predetermined intervals on the long side 61a of the molding resin 60. In the present embodiment, when the control lead frames do not need to be particularly distinguished from each other, any one of the control lead frames will be referred to as a control lead frame 30. Likewise, when the main current lead frames do not need to be particularly distinguished from each other, any one of the main current lead frames will be referred to as a main current lead frame 40.

The semiconductor device 10 also includes an attachment hole 60a on each of the pair of short sides 61b and 61d of the molding resin 60. For example, an attachment hole 60a may be formed approximately at the center of each of the short sides 61b and 61d. The locations of the attachment holes 60a in FIGS. 1A and 1B are only examples, and the attachment holes 60a may be formed at different locations. The individual attachment hole 60a has a diameter such that a bolt (not illustrated) is to be inserted thereinto. These attachment holes 60a pass through the molding resin 60 from the front surface to the rear surface thereof. The attachment holes 60a are formed outside the insulating sheet 70 in plan view. A cooling unit may be attached to the semiconductor device 10 by inserting a bolt into the individual attachment hole 60a and performing screwing. The cooling unit is, for example, a heatsink or a cooling device that performs cooling with refrigerant. In the present embodiment, these attachment holes 60*a* each have a U-shape in plan view. Alternatively, the attachment holes 60*a* may each have a circular shape in plan view. The semiconductor device 10 includes a pair of concave step parts 60*e* and 60*f* on the rear surface of the molding resin 60 along the long sides 61*a* and 61*c*. For example, the step parts 60*e* and 60*f* are formed outside main die pads 44*a* to 47*a* and control die pads 38*a*1 and 38*a*2 (along the long sides 61*a* and 61*c*) (for example, see FIG. 4). In addition, concave portions 60*b*1 and 60*b*2 are formed on the front surface of the molding resin 60. In FIGS. 1A and 1B, four concave portions 60*b*1 and five concave portions 60*b*2 arranged in a line are formed. For example, these concave portions 60*b*1 are formed at locations corresponding to four corners of the insulating sheet 70 illustrated in FIG. 3. For example, an individual concave portion 60*b*2 is formed at a location facing a location between two neighboring main die pads among the main die pads 44*a* to 47*a*.

In addition, as illustrated in FIG. 2, the semiconductor device 10 has injection cut-off surfaces 60*c* at six locations on the long side 61*a* in the lengthwise direction of the molding resin 60 among the main current lead frames 41 to 47. That is, each of the injection cut-off surfaces 60*c* is formed between two neighboring main current lead frames among the main current lead frames 41 to 47 on the long side 61*a*. That is, each of the injection cut-off surfaces 60*c* is formed between two neighboring main current lead frames 40. The injection cut-off surfaces 60*c* and the main current lead frames 40 are arranged in a line in the lengthwise direction on the long side 61*a*. As will be described below, the locations where the injection cut-off surfaces 60*c* are formed correspond to the locations of the inlets of a mold into which liquid molding resin raw material is injected. The injection cut-off surfaces 60*c* are marks that are formed after the molding resin raw material injected into the mold is solidified and the solidified molding resin extending from the inlets to the outside is cut off. Thus, the cross section of the individual injection cut-off surface 60*c* corresponds to the shape of its corresponding inlet. In addition, the surfaces of the injection cut-off surfaces 60*c* are coarser than those of the other portions on the long side 61*a*. In addition, the injection cut-off surfaces 60*c* are more radiant (sparkling) than the other portions on the long side 61*a*. Thus, the injection cut-off surfaces 60*c* are tactually and visually different from the molding resin 60. For this reason, the locations where the injection cut-off surfaces 60*c* are formed are easily identifiable on the semiconductor device 10.

In the case of this semiconductor device 10, components as illustrated in FIGS. 3 and 4 are sealed by the molding resin 60. That is, the semiconductor device 10 includes three semiconductor chips 21, semiconductor chips 22 to 24, the control lead frames 30 (including control lead frames 31 to 38), the main current lead frames 40 (including the main current lead frames 41 to 47), control ICs 50*h* and 50*l*, electronic parts 51*a* to 51*c*, and the insulating sheet 70. In addition, four areas are set on the molding resin 60 of the semiconductor device 10 in plan view. That is, a bottom right area HM, a bottom left area LM neighboring the area HM in the direction of the short side 61*b*, a top right area HC neighboring the area HM in the direction of the long side 61*c*, and a top left area LC neighboring the area HC in the direction of the short side 61*b* are set on the molding resin 60 in FIG. 3. The areas HM and HC are in a high side area of the semiconductor device 10. This high side area is a wiring area of an upper arm included in a circuit configuration of the semiconductor device 10. The voltage range in the high side area is, for example, between 400 V and 700 V, inclusive. The areas LM and LC are in a low side area of the semiconductor device 10. This low side area is a wiring area of a lower arm included in the circuit configuration of the semiconductor device 10. The voltage range in the low side area is lower than the voltage range of the high side area, and is, for example, between 15 V and 25 V, inclusive.

Each of the above components of the semiconductor device 10 is formed in a corresponding one of the above areas. The three semiconductor chips 21 constituting the upper arm are disposed in the area HM. The semiconductor chips 22 to 24 constituting the lower arm are disposed in the area LM. The control IC 50*h* and the electronic parts 51*a* to 51*c* are disposed in the area HC. The control IC 50*h* is a high voltage integrated circuit (HVIC). The control IC 50*l* is disposed in the area LC. Each of the control ICs 50*h* and 50*l* has an electrode (a front surface electrode) on its front surface. The control IC 50*l* is a low voltage integrated circuit (LVIC). The electronic parts 51*a* to 51*c* are passive elements, such as thermistors, capacitors, or resistors.

Figure 9:
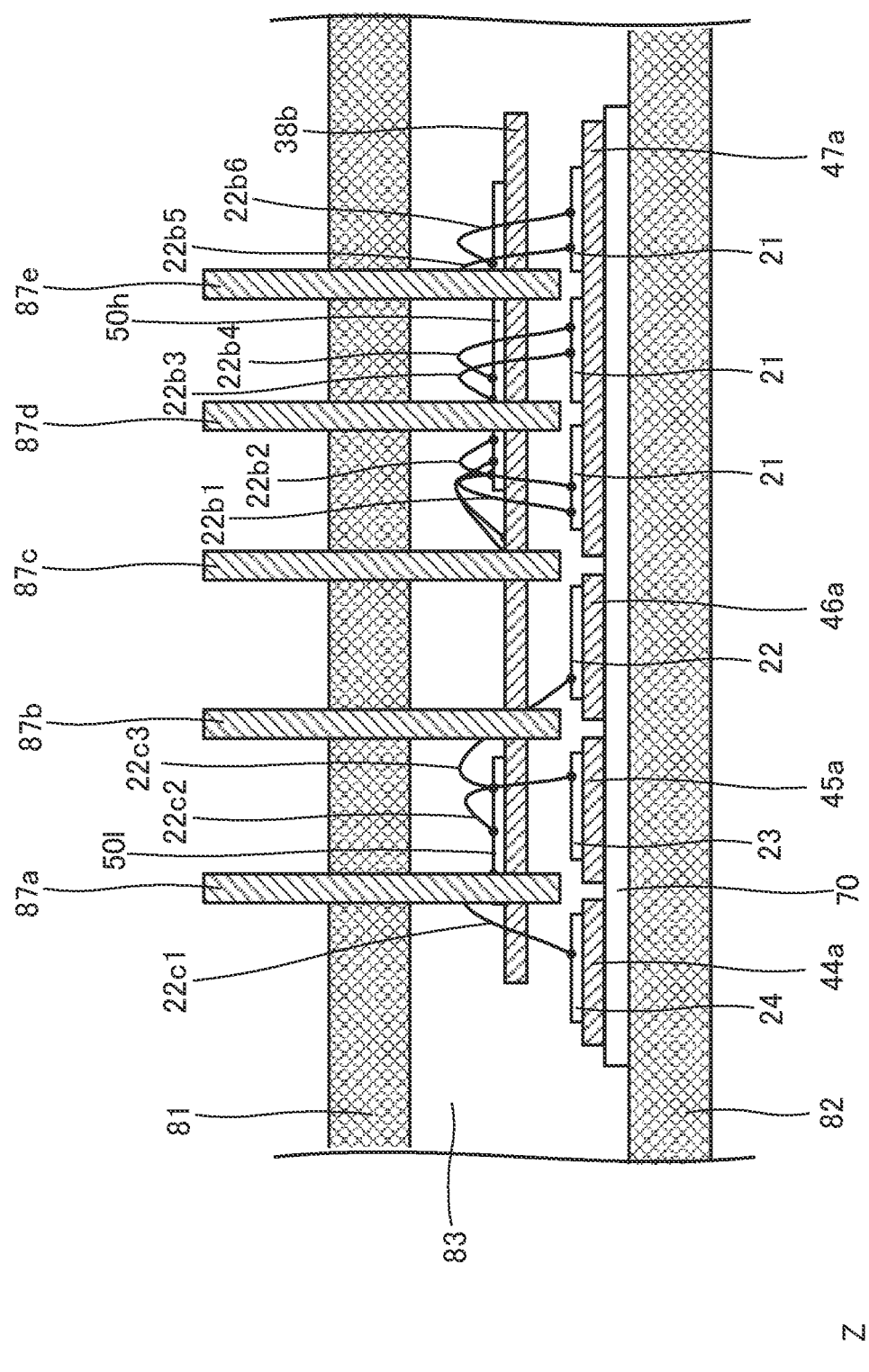
FIG. 9 is a sectional view (part 2) illustrating the placement step included in the semiconductor device manufacturing method according to the first embodiment.

The control IC 50*h* is directly connected to the three semiconductor chips 21 via control wires 22*b*, which are distinguished from each other as control wires 22*b*1 to 22*b*6, as illustrated in FIG. 9. In addition, the control IC 50*h* is directly connected to the electronic parts 51*a* to 51*c* and some of the control lead frames 30 via control wires 22*a*. In the present embodiment, two control wires 22*b* are used to connect the control IC 50*h* and a single semiconductor chip 21. One of the two control wires 22*b* is for a gate electrode of this semiconductor chip 21 constituting the upper arm, and the other control wire 22*b* is for detection of an emitter of the semiconductor chip 21 constituting the upper arm. In the area HM, the three semiconductor chips 21 are connected in parallel to each other. A gate signal is applied from a control wire 22*b* connected to the gate electrode of a corresponding semiconductor chip 21. This gate signal uses the potential of the control wire 22*b* connected to the corresponding main electrode (the emitter electrode) on the front surface of the semiconductor chip 21 as a reference. That is, the individual control wire 22*b* has the same potential as the midpoint potential between a power device of the upper arm and a power device of the lower arm. Thus, at the time of switching of the individual semiconductor chip 21 in the upper arm, a voltage between 400 V and 700V, inclusive, is applied to the individual control wire 22*b*.

The control IC 50*l* is directly connected to the semiconductor chips 22 to 24 via control wires 22*c*. The control wires 22*c* are distinguished as control wires 22*c*1 to 22*c*3, as illustrated in FIG. 9. The control IC 50*l* is directly connected to some of the control lead frames 30 via control wires 22*d*. The control wires 22*c* are for the gate electrodes of the semiconductor chips 22 to 24 constituting the lower arm. Thus, a voltage between 15 V and 25 V, inclusive, is applied to these control wires 22*c*.

In addition, the three semiconductor chips 21 and the main current lead frames 44 to 46 (main current terminals 44*c* to 46*c*) are directly connected to each other via main current wires 22*e*. The semiconductor chips 22 to 24 are directly connected to the main current lead frames 43 to 41, respectively, via main current wires 22*e*.

In addition, the control wires 22*b* connect the three semiconductor chips 21 and the control IC 50*h*. That is, the control wires 22*b* extend in a direction (Y direction) perpendicular to the long side 61*a* and the long side 61*c*. The wiring angle of the individual control wire 22*b* is within ±45° from the direction (Y direction) perpendicular to the lengthwise direction of the long side 61*a*.

The control wires 22c connect the semiconductor chips 22 to 24 and the control IC 50l. That is, the control wires 22c extend in the direction (Y direction) perpendicular to the long side 61a and the long side 61c. The wiring angle of the individual control wire 22c is within 145° from the direction (Y direction) perpendicular to the lengthwise direction of the long side 61a.

In addition, the distance between two of the plurality of control wires 22b is shorter than the distance between two of the plurality of control wires 22c. In particular, the distance between the midpoint of the bonding points of a control wire 22b connecting a semiconductor chip 21 and the control IC 50h and the midpoint of the bonding points of another control wire 22b connecting another semiconductor chip 21 and the control IC 50h is shorter than the distance between the midpoints of two neighboring control wires 22c. That is, the control wires 22b are closer to each other than the control wires 22c. Thus, since the control wires 22c are relatively widely distanced from each other, the control wires 22c do not easily come into contact with each other. The control wires 22a to 22d and the main current wire 22e are made of material having excellent electrical conductivity. Examples of the material include gold, silver, copper, aluminum, and an alloy containing at least one of these kinds. The control wires 22a to 22d each have a diameter, for example, between, 10 μm and 250 μm, inclusive. The main current wires 22e each have a diameter, for example, between 300 μm and 500 μm, inclusive.

The semiconductor chips 21 to 24 are each made of silicon, silicon carbide, or gallium nitride as its main component. These semiconductor chips 21 to 24 each include a reverse conducting (RC)-IGBT as a switching element, which is obtained by forming an IGBT and an FWD on a single chip. Each RC-IGBT chip includes a circuit in which an IGBT and an FWD are connected in reverse-parallel to each other. Each of these semiconductor chips 21 to 24 includes an input electrode (a collector electrode) as a main electrode on its rear surface. In addition, each of the semiconductor chips 21 to 24 has a control electrode (a gate electrode) and an output electrode (an emitter electrode) on its front surface. The gate electrodes of the semiconductor chips 21 to 24 illustrated in FIG. 3 are disposed at locations in the direction of the long side 61c. The semiconductor chips 21 to 24 each have a thickness, for example, between 50 μm and 220 μm, inclusive. Six pairs of semiconductor chips, each pair being a semiconductor chip including a switching element and a semiconductor chip including a diode element, may be disposed in place of these semiconductor chips 21 to 24. In this case, the switching elements of the semiconductor chips are, for example, power MOSFETs or IGBTs. Each of these semiconductor chips includes, for example, a drain electrode (a positive electrode or a collector electrode in the case of an IGBT) as a main electrode on its rear surface and a gate electrode (a control electrode) as a control electrode and a source electrode (a negative electrode or an emitter electrode in the case of an IGBT) as a main electrode on its front surface. The diode elements of the semiconductor chips are FWDs such as SBDs or PiN diodes. Each of these semiconductor chips includes a cathode electrode as a main electrode on its rear surface and an anode electrode as a main electrode on its front surface. In addition, while the six semiconductor chips 21 to 24 are arranged in the present embodiment, the number of semiconductor chips is not limited to 6. A different number of pairs of semiconductor chips may be disposed, for example, depending on the specifications of the semiconductor device 10.

Each of the rear surfaces of the semiconductor chips 21 to 24 is bonded to a predetermined one of the main current lead frames 40 via solder (not illustrated). The solder is lead-free solder containing a predetermined alloy as its main component. The predetermined alloy is at least one of a tin-silver alloy, a tin-zinc alloy, and a tin-antimony alloy, for example. An additive such as copper, bismuth, indium, nickel, germanium, cobalt, or silicon may be contained in the solder. Instead of soldering, the above bonding may be performed by sintering using sintered material. In this case, the sintered material is, for example, silver, gold, or copper powder.

The main electrodes on the front surfaces of the semiconductor chips 21 to 24 are directly connected to their respective main current lead frames 40 via their respective main current wires 22e. In addition, the gate electrodes on the front surfaces of the semiconductor chips 21 are directly connected to electrodes on the front surface of the control IC 50h via their respective control wires 22b. The gate electrodes on the front surfaces of the semiconductor chips 22 to 24 are directly connected to electrodes on the front surface of the control IC 50l via their respective control wires 22c.

The plurality of main current lead frames 40 are arranged near the long side 61a of the semiconductor device 10 along the long side 61a. A second end of each of the plurality of main current lead frames 40 extends downward in FIG. 3 from the long side 61a of the semiconductor device 10 and perpendicularly to the long side 61a. Among the plurality of main current lead frames 40, the main current lead frame 44 has the main die pad 44a, a linkage part 44b, and the main current terminal 44c, which are integrally connected with each other. The same applies to the main current lead frames 45 to 47, that is, their respective portions 45a to 45c, 46a to 46c, and 47a to 47c. In FIG. 4, the main current lead frames 46 and 47 are illustrated. The main current lead frames 46 and 47 each include a step. Likewise, the main current lead frames 44 and 45 each include a step.

The main die pads 44a to 47a are formed separately from each other in parallel to the long side 61a in plan view. In addition, the main die pads 44a to 47a are formed at a lower level than the main current terminals 44c to 47c, respectively. The semiconductor chips 21 to 24 are bonded to the front surfaces of the main die pads 44a to 47a and covered by the molding resin 60. In addition, the insulating sheet 70 is attached to the rear surfaces of the main die pads 44a to 47a. The main die pads 44a to 47a may extend approximately in parallel to the front surface and the rear surface of the molding resin 60. Each of the main die pads 44a to 47a is integrally connected to one end of a corresponding one of the linkage parts 44b to 47b.

A first end of each of the main current terminals 44c to 47c is sealed by the molding resin 60 and is integrally connected to a second end of a corresponding one of the linkage parts 44b to 47b. The second end of each of the main current terminals 44c to 47c extends from the long side 61a of the molding resin 60 to the outside. The main current terminals 44c to 47c may extend in parallel to the front surface and the rear surface of the molding resin 60. The main current terminals 44c to 47c are separated from the main die pads 44a to 47a in the direction of the long side 61a and are separated from the locations where the main die pads 44a to 47a are disposed (from the bottom surface of the molding resin 60) in the direction of the front surface of the molding resin 60 by a predetermined height. That is, the main die pads 44a to 47a are located at a height different from that of the main current terminals 44c to 47c, and the linkage parts 44b to 47b connect the main die pads 44a to 47a and the main current terminals 44c to 47c, respectively. Thus, the main current lead frames 44 to 47 extend from their respective locations having a predetermined height on the long side 61*a* in the direction of the inner rear surface of the molding resin 60 and are slanted with respect to the front surface and the rear surface of the molding resin 60. Thus, each of the main current lead frames 44 to 47 includes a step between a corresponding one of the main die pads 44*a* to 47*a* and a corresponding one of the main current terminals 44*c* to 47*c*. The linkage parts 44*b* to 47*b* are sealed by the molding resin 60. The main current terminals 44*c* to 46*c* are partially sealed by the molding resin 60, and the sealed portions are connected to their respective main current wires 22*e* connected to their respective semiconductor chips 21. The main current terminals 44*c* to 47*c* may first extend from the long side 61*a* of the molding resin 60 and next bend such that the main current terminals 44*c* to 47*c* extend in parallel to the long side 61*a*.

In addition, the main current lead frames 41 to 43 are also located at the same height as that of the main current terminals 44*c* to 47*c*, and the second end of each of the main current lead frames 41 to 43 extends from the long side 61*a* of the molding resin 60 to the outside. The main current lead frames 41 to 43 may first extend from the long side 61*a* of the molding resin 60 and next bend such that the main current lead frames 41 to 43 extend in parallel to the long side 61*a*. The main current lead frames 41 to 43 are partially sealed by the molding resin 60, and the sealed portions are connected to their respective main current wires 22*e* connected to their respective semiconductor chips 24 to 22.

The plurality of control lead frames 30 (including the control lead frames 31 to 38) are formed further in the direction of the long side 61*c* (+Y direction) of the molding resin 60 than the main current lead frames 44 to 47, the long side 61*c* being opposite to the long side 61*a* from which the main current lead frames 44 to 47 extend. The plurality of control lead frames 30 may be formed without a step inside the molding resin 60 and may extend in parallel to the front surface and the rear surface of the molding resin 60. The plurality of control lead frames 30 are located at the same height as that of the main current terminals 44*c* to 47*c* of the main current lead frames 44 to 47. Thus, the plurality of control lead frames 30 are located at a higher level than the main die pads 44*a* to 47*a* of the main current lead frames 44 to 47. A second end of each of the control lead frames 30 extends from the long side 61*c* of the semiconductor device 10 to the outside.

The plurality of control lead frames 30 include the control die pads 38*a*1 and 38*a*2 (first control die pads) and control terminals 38*b*1, 38*b*2, and 38*b*3. The control lead frames 30 may also include control die pads 31*a*, 33*a*, and 35*a* (second control die pads) and control terminals 31*b*, 33*b*, and 35*b* disposed further in the +Y direction than the control die pads 38*a*1 and 38*a*2 (first control die pads).

The control ICs 50*l* and 50*h* are disposed on the front surfaces (+Z direction) of the control die pads 38*a*1 and 38*a*2 (first control die pads). The control terminal 38*b*1 is integrally connected to the control die pad 38*a*1, and the control terminal 38*b*2 is integrally connected to the control die pad 38*a*2. The control terminals 38*b*1 and 38*b*2 extend from the long side 61*c* upward in FIG. 3 (+Y direction). The control terminal 38*b*1 extends from the area HC on the long side 61*c* of the molding resin 60 into the molding resin 60 and is connected to the control die pad 38*a*1 in the area HC. The control terminal 38*b*2 extends from the area LC on the long side 61*c* of the molding resin 60 into the molding resin 60 and is connected to the control die pad 38*a*2 in the area LC. The control die pad 38*a*1 and the control die pad 38*a*2 may be connected to each other by the control terminal 38*b*3. The control terminal 38*b*3 is integrally connected to the control die pads 38*a*1 and 38*a*2. The control terminal 38*b*3 extends in parallel to the long side 61*c* (±X directions).

The electronic parts 51*a*, 51*b*, and 51*c* are bonded to the front surfaces (+Z direction) of the control die pads 31*a*, 33*a*, and 35*a* (second control die pads) via solder. The control terminals 31*b*, 33*b*, and 35*b* are connected integrally with the control die pads 31*a*, 33*a*, and 35*a*, respectively. The control terminals 31*b*, 33*b*, and 35*b* extend upward (+Y direction) in FIG. 3 from the long side 61*c*.

The semiconductor chips 21 are directly connected to the control IC 50*h* via the control wires 22*b*. As described above, the individual control lead frame 30 on which the control IC 50*h* is disposed is located at a higher level than the main die pads 44*a* to 47*a* on which the semiconductor chips 21 are disposed. Thus, the control wires 22*b* are connected to the front surface of the control IC 50*h* and the front surfaces of the semiconductor chips 21 lower than the front surface of the control IC 50*h*. Likewise, the semiconductor chips 22 to 24 are directly connected to the control IC 50*l* via the control wires 22*c*. The control wires 22*c* are also connected to the front surface of the control IC 50*l* and the front surfaces of the semiconductor chips 22 to 24 lower than the front surface of the control IC 50*l*, as is the case with the control wires 22*b*. Thus, each of the control wires 22*b* and 22*c* forms a high loop and is long. In addition, each of the control wires 22*b* and 22*c* first extends upward (+Z direction) from its bonding location on a corresponding one of the control ICs 50*h* and 50*l*, next forms an arch, and finally extends downward (−Z direction). Thus, the control wires 22*b* and 22*c* easily come into contact with end portions of the control ICs 50*h* and 50*l* or the control lead frames 30 on which the control ICs 50*h* and 50*l* are disposed, these control ICs 50*h* and 50*l* and control lead frames 30 being located at a higher level than the main die pads 44*a* to 47*a*.

In addition, the electronic parts 51*a* to 51*c* and the control lead frames 31, 33, and 35 are directly connected to the control IC 50*h* via some control wires 22*a*. In addition, the control lead frames 32, 34, 36, and 38 (control terminal 38*b*1), etc. are directly connected to the control IC 50*h* via some control wires 22*a*. Some control lead frames 30 (including the control terminal 38*b*2) except the above are directly connected to the control IC 50*l* via the control wires 22*d*.

The plurality of main current lead frames 40 and the plurality of control lead frames 30 are made of material having excellent electrical conductivity. Examples of the material include copper, aluminum, and an alloy containing at least one of these kinds, for example. The plurality of main current lead frames 40 and the plurality of control lead frames 30 have a thickness, preferably, between 0.10 mm and 1.00 mm, inclusive, more preferably, between 0.20 mm and 0.50 mm, inclusive. In addition, the plurality of main current lead frames 40 and the plurality of control lead frames 30 may be plated with material having excellent corrosion resistance. Examples of this material include nickel, gold, and an alloy containing at least one of these kinds, for example.

The molding resin 60 contains thermosetting resin and inorganic filler contained therein. For example, the thermosetting resin contains, as its main component, at least one kind selected from a group including epoxy resin, phenol resin, and melamine resin. Preferably, the thermosetting resin contains epoxy resin as its main component. In addition, inorganic material having a high insulating property and high thermal conductivity is used as the inorganic filler.

For example, the inorganic material contains, as its main component, at least one kind selected from a group including aluminum oxide, aluminum nitride, silicon nitride, boron nitride and silicon oxide. Preferably, the inorganic filler contains silicon oxide as its main component. By using silicon oxide, the inorganic filler serves as mold release agent as well. In addition, it is possible to maintain a high flame retardance without blending halogen-based, antimony-based, or metal hydroxide-based flame retardant, for example. The inorganic filler is between 70 vol % and 90 vol %, inclusive, of the sealing raw material.

The insulating sheet 70 also contains thermosetting resin and inorganic filler contained therein. For example, the thermosetting resin contains, as its main component, at least one kind selected from a group including epoxy resin, phenol resin, melamine resin, and polyimide resin. Preferably, the thermosetting resin contains epoxy resin as its main component. In addition, inorganic material containing, as its main component, at least one kind selected from a group including aluminum oxide, aluminum nitride, silicon nitride, and boron nitride having a high insulating property and high thermal conductivity is used as the filler. In addition, it is preferable that the molding resin 60 and the insulating sheet 70 contain the same thermosetting resin as their main component. More preferably, the thermosetting resin of the molding resin 60 and the thermosetting resin of the insulating sheet 70 contain epoxy resin as their main component.

The insulating sheet 70 has a rectangular shape in plan view, for example. The insulating sheet 70 has a thickness between 50 μm and 1.2 mm, inclusive. On the front surface of the insulating sheet 70, the main die pads 44a to 47a of the plurality of main current lead frames 44 to 47 are disposed separately from each other in a line in a lengthwise direction (±X directions) of the insulating sheet 70. The insulating sheet 70 has a size such that at least the plurality of main die pads 44a to 47a are disposed. Thus, the insulating sheet 70 may have a larger size than that illustrated in FIG. 3. Since the surrounding area of the main die pads 44a to 47a is covered, even if the semiconductor device 10 is deformed, the insulating property is maintained more reliably.

In addition, as described above, the rear surface of the insulating sheet 70 is exposed to the outside from the rear surface of the molding resin 60 and is on the same plane with the rear surface of the molding resin 60. Since the insulating sheet 70 covers the rear surfaces of the main die pads 44a to 47a as described above, the insulating property between the main die pads 44a to 47a and the outside is maintained. In addition, the insulating sheet 70 releases the heat, which is generated by the semiconductor chips 21 to 24 and transferred by the main die pads 44a to 47a, to the outside of the semiconductor device 10. That is, the insulating sheet 70 contributes to the heat dissipation of the semiconductor device 10.

Figure 5:
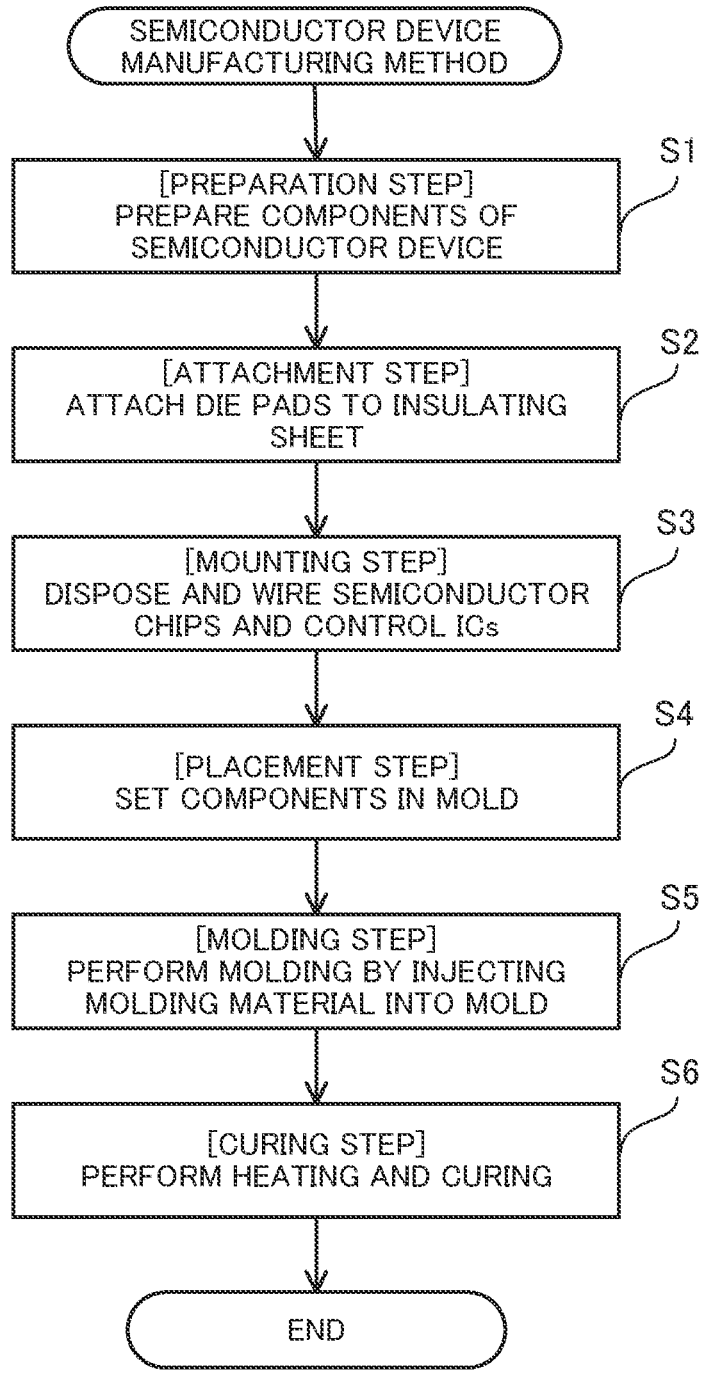
FIG. 5 is a flowchart illustrating a semiconductor device manufacturing method according to the first embodiment.
Figure 6:
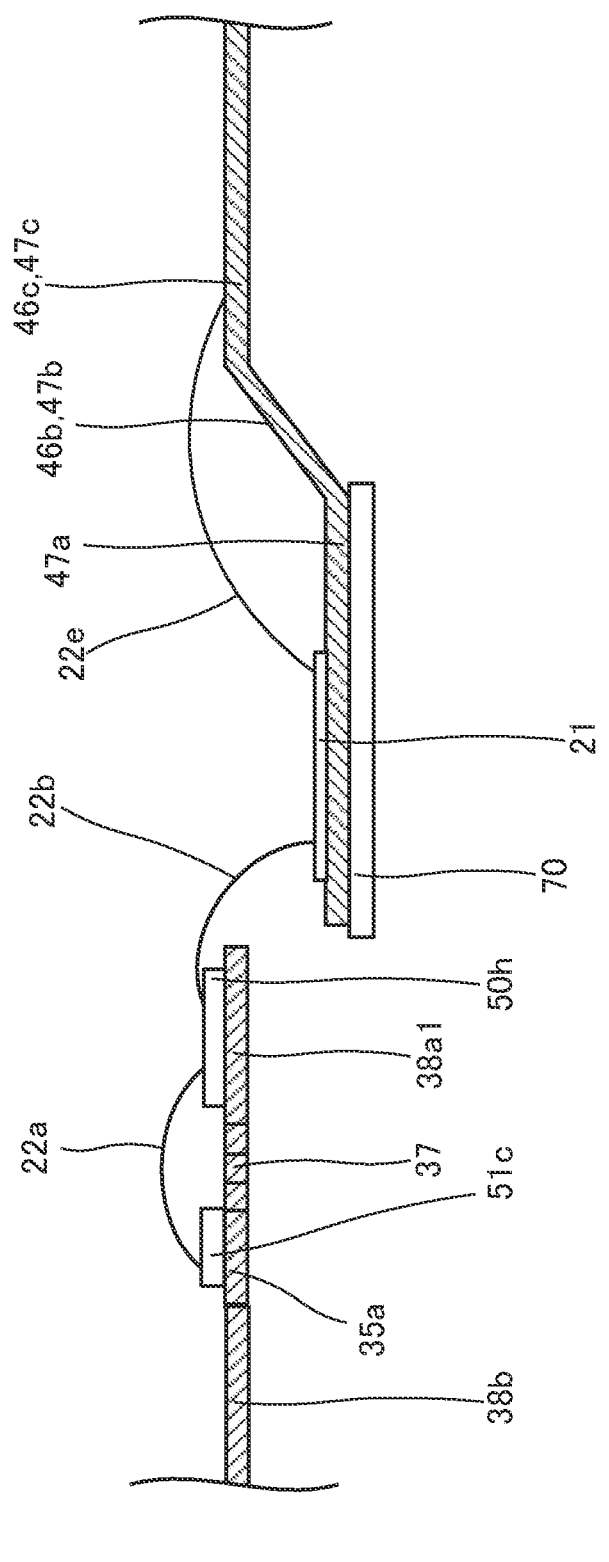
FIG. 6 illustrates a mounting step included in the semiconductor device manufacturing method according to the first embodiment.
Figure 7:
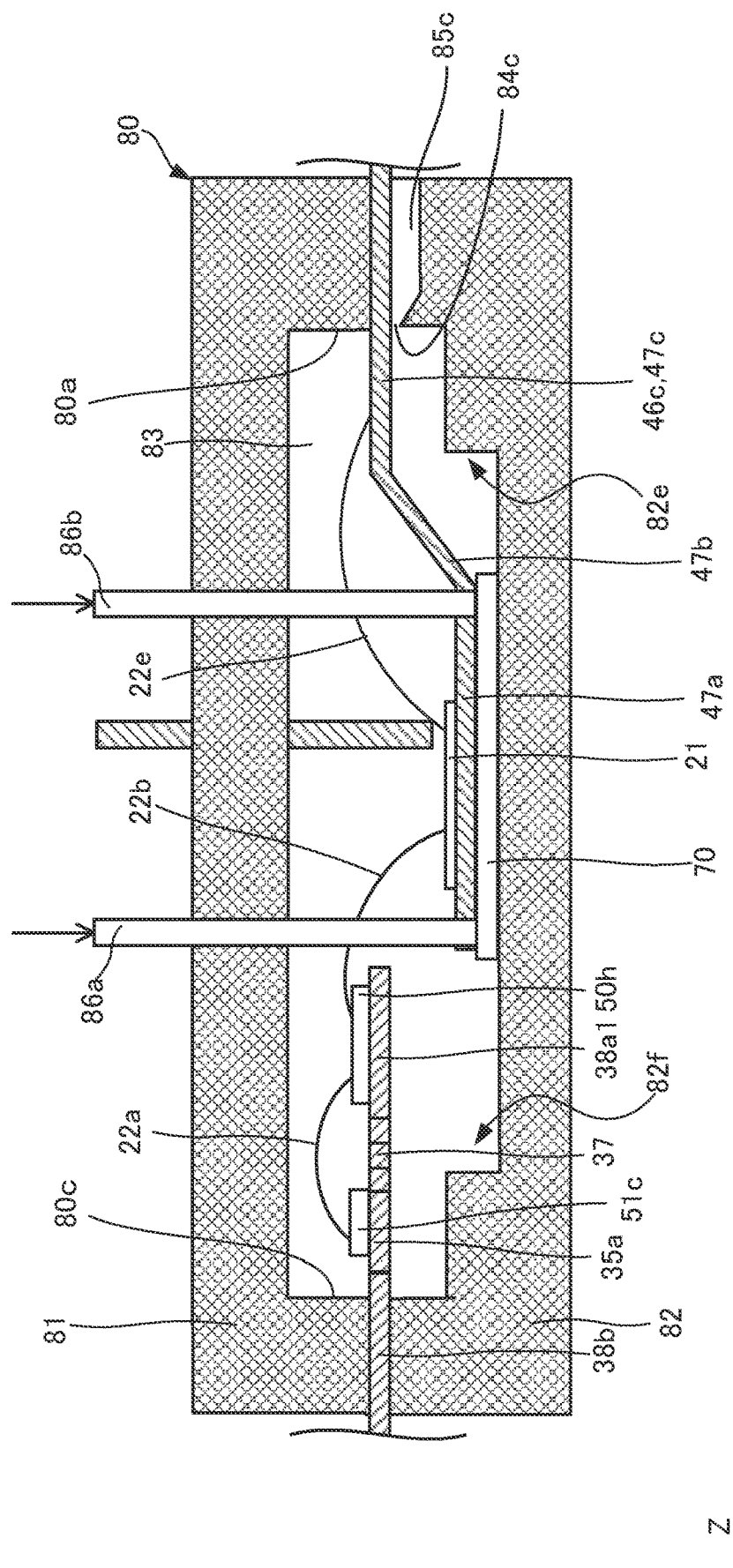
FIG. 7 is a sectional view (part 1) illustrating a placement step included in the semiconductor device manufacturing method according to the first embodiment.
Figure 8:
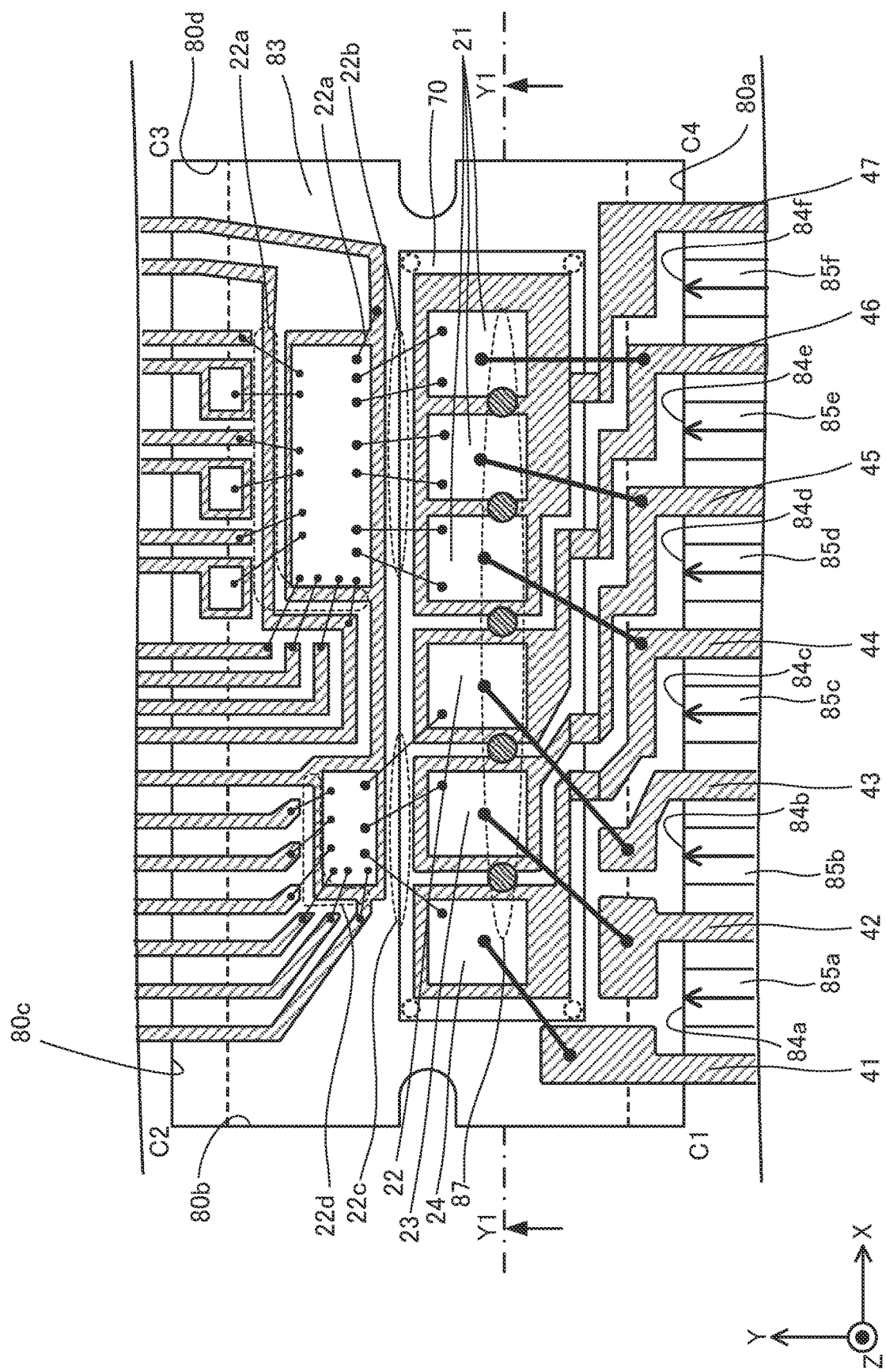
FIG. 8 is a plan view illustrating the placement step included in the semiconductor device manufacturing method according to the first embodiment.
Figure 11:
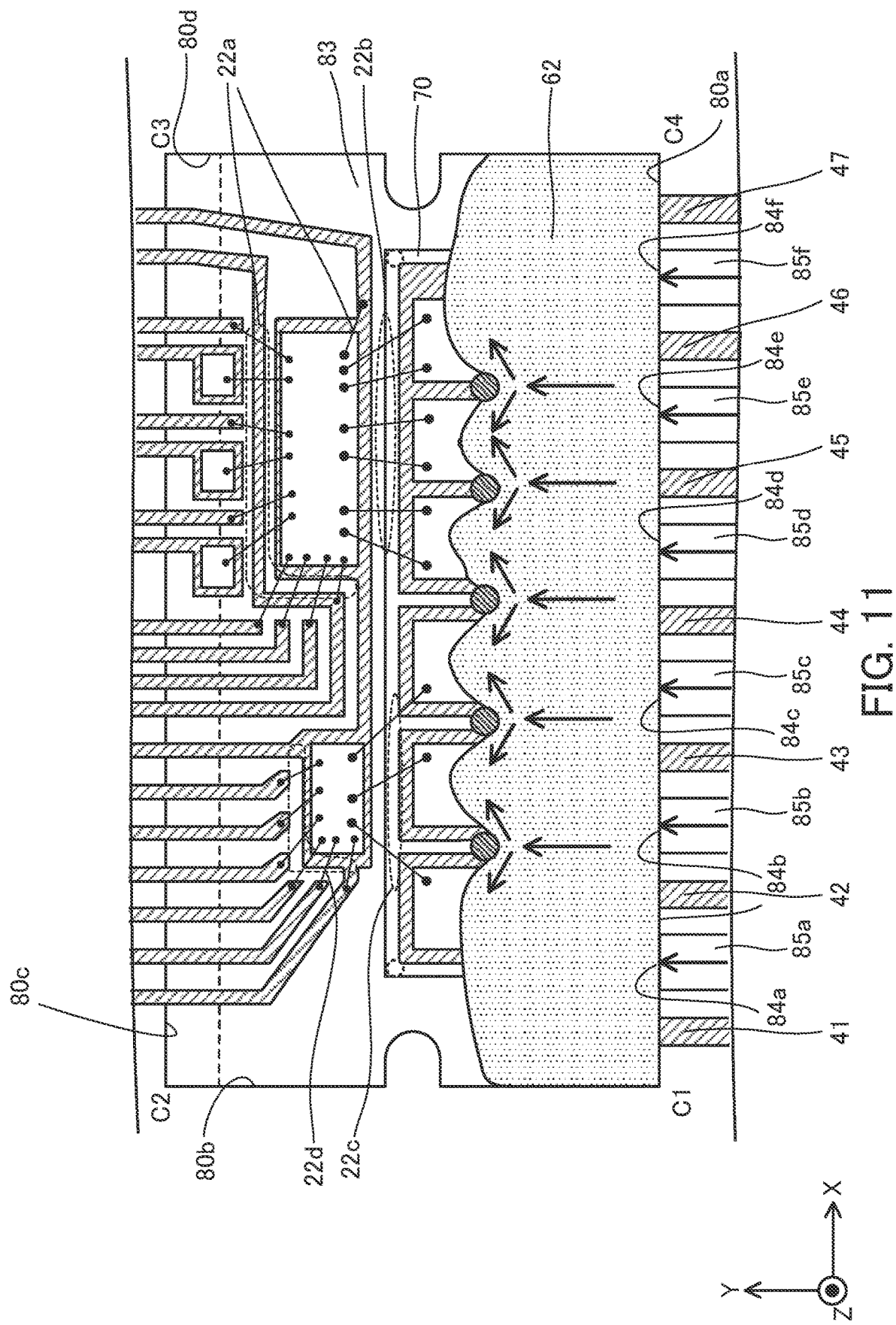
FIG. 11 is a plan view (part 2) illustrating the molding step included in the semiconductor device manufacturing method according to the first embodiment.
Figure 12:
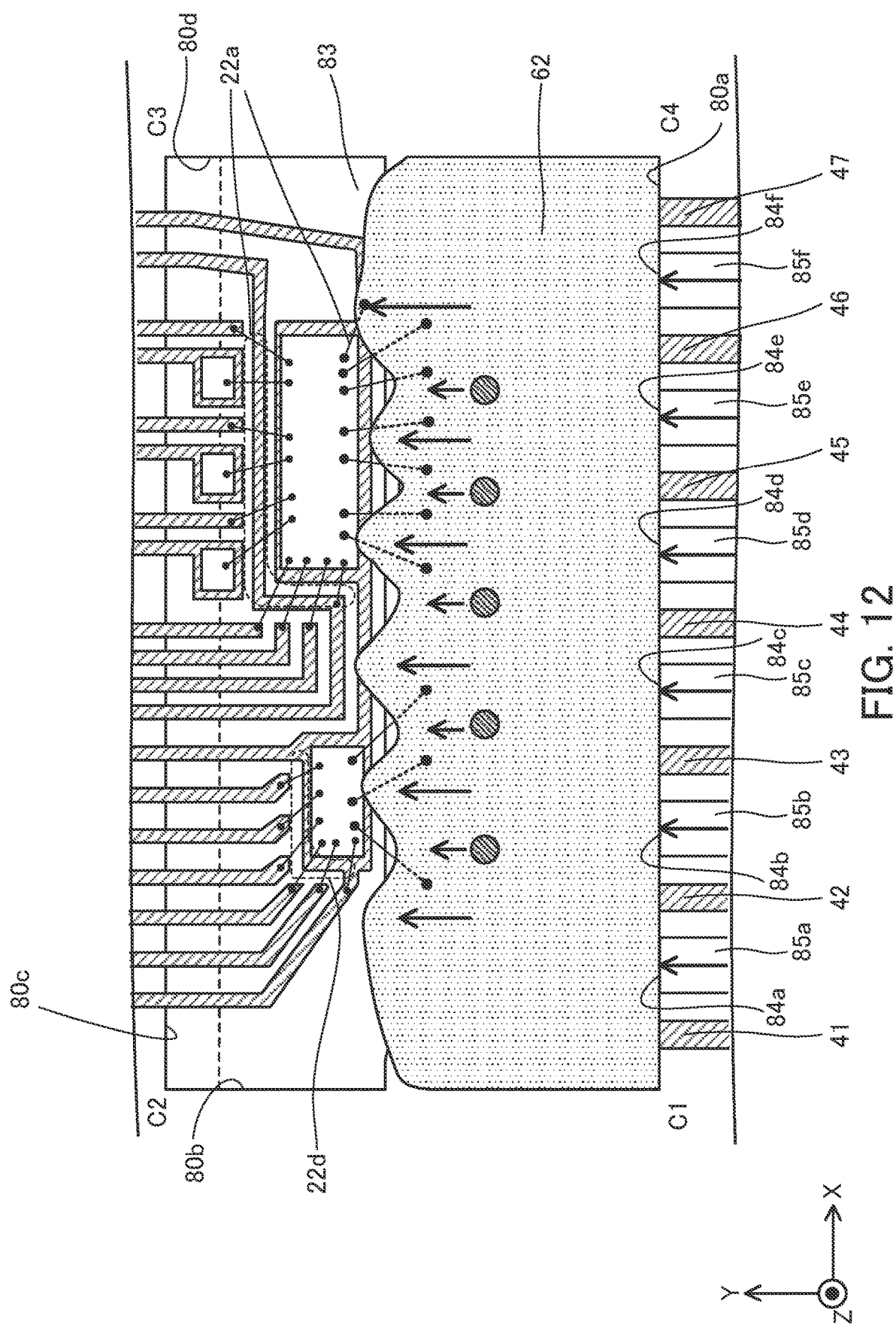
FIG. 12 is a plan view (part 3) illustrating the molding step included in the semiconductor device manufacturing method according to the first embodiment.
Figure 13:
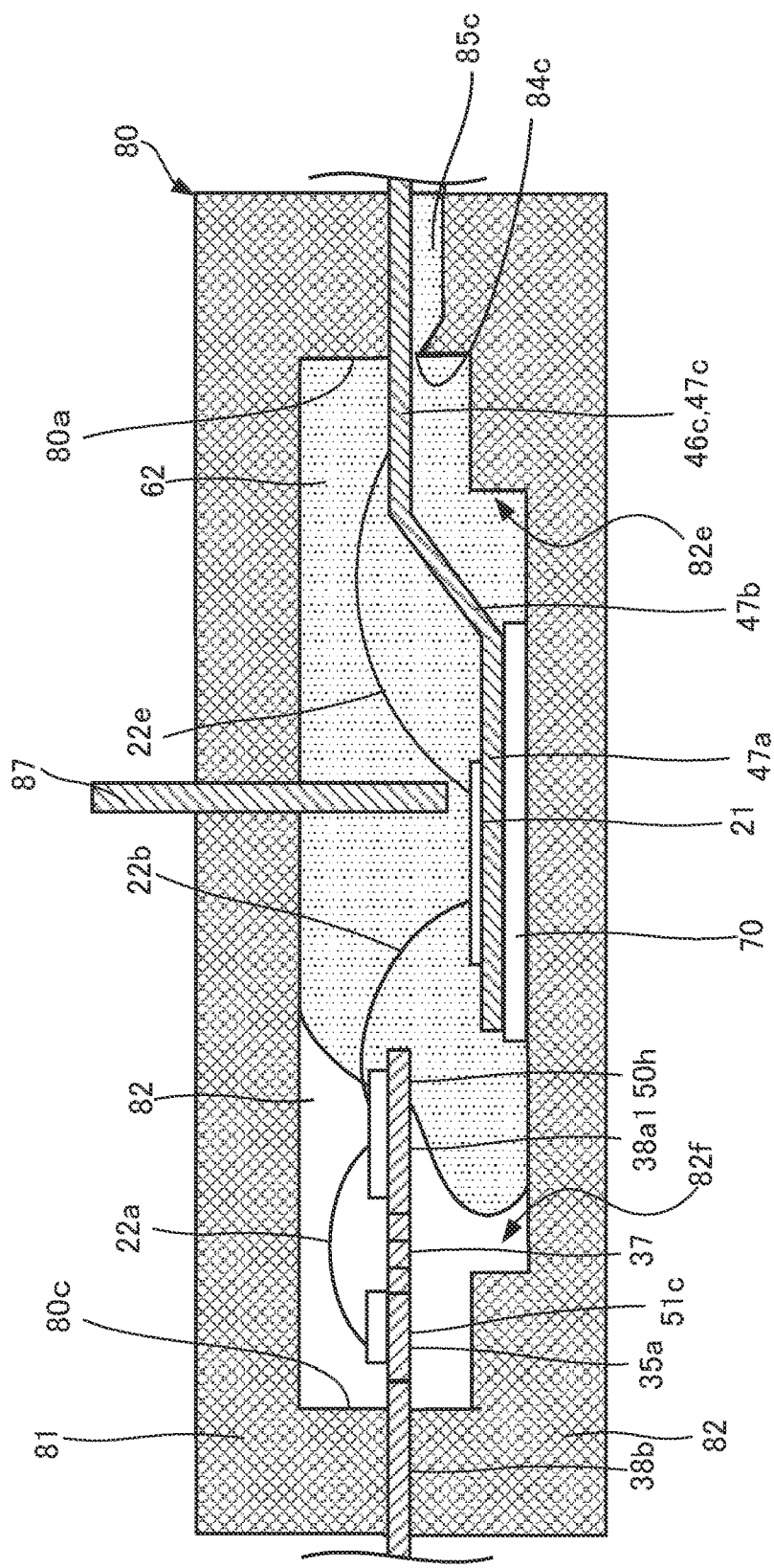
FIG. 13 is a sectional view illustrating the molding step included in the semiconductor device manufacturing method according to the first embodiment.

Next, a manufacturing method of the semiconductor device 10 will be described with reference to FIGS. 5 to 14. FIG. 5 is a flowchart illustrating a semiconductor device manufacturing method according to the first embodiment. FIG. 6 illustrates a mounting step included in the semiconductor device manufacturing method according to the first embodiment. FIGS. 7 and 9 are each a sectional view illustrating a placement step included in the semiconductor device manufacturing method according to the first embodiment. FIG. 8 is a plan view illustrating the placement step included in the semiconductor device manufacturing method according to the first embodiment. FIGS. 10 to 12 and FIG. 14 are each a plan view illustrating a molding step included in the semiconductor device manufacturing method according to the first embodiment. FIG. 13 is a sectional view illustrating the molding step included in the semiconductor device manufacturing method according to the first embodiment.

FIGS. 6, 7, and 13 are each a sectional view taken along the dashed-dotted line X1-X1 in FIG. 3, as in FIG. 4. FIG. 8 and FIGS. 10 to 12 each illustrates the inside of a cavity 83 of a mold 80 in plan view. In FIG. 8, an upper mold 81 of the mold 80 is not illustrated. FIG. 9 is a sectional view taken along a dashed-dotted line Y1-Y1 in FIG. 8. The following description will be made by using the cross section illustrated in FIG. 4 as an example.

First, a preparation step of preparing components of the semiconductor device 10 is performed (step S1 in FIG. 5). The semiconductor chips 21 to 24, the control ICs 50h and 50l, the main current lead frames 40, the control lead frames 30, and molding resin raw material 62 are at least prepared as the components of the semiconductor device 10. The electronic parts 51a to 51c and a semi-cured insulating sheet 70 may also be prepared.

The main current lead frames 40 and the control lead frames 30 may be prepared as a metal plate having wiring patterns integrated by a tie bar or the like. The main current lead frames 40 include the main die pads 44a to 47a and the main current terminals 44c to 47c integrally connected to the main die pads 44a to 47a, respectively, and extending in the −Y direction (first direction). The control lead frames 30 are formed further in the +Y direction (second direction) than the main current lead frames 40. The control lead frames 30 include the control die pads 38a1 and 38a2 (first control die pads) and the control terminals 38b1 and 38b2 integrally connected to the control die pads 38a1 and 38a2 (first control die pads) and extending in the +Y direction from the control die pads 38a1 and 38a2. The control lead frames 30 may further include the control die pads 31a, 33a, and 35a (second control die pads) further in the +Y direction than the control die pads 38a1 and 38a2 (first control die pads) and the control terminals 31b, 33b, 35b extending further in the +Y direction from the control die pads 31a, 33a, and 35a, respectively. That is, in the case of this metal plate, the main current lead frames 40 are formed in the −Y direction and the control lead frames 30 are formed in the +Y direction in plan view. In addition, the main current terminals 44c to 47c extend in the −Y direction, and the control terminals 38b1, 38b2, 31b, 33b, and 35b extend in the +Y direction.

To manufacture this metal plate including the main current lead frames 40 and the control lead frames 30, for example, etching or punching is performed on a single metal plate such that the portions corresponding to the main current lead frames 40 and the control lead frames 30 are formed. Next, the steps are formed by pressing using a predetermined mold. In this way, a metal plate having wiring patterns in which the portion corresponding to the main current lead frames 40 and the portion corresponding to the control lead frames 30 are integrated by a tie bar or the like is obtained.

The insulating sheet 70 is a sheet containing semi-cured (stage B) thermosetting resin and inorganic filler. For example, the insulating sheet 70 is manufactured as follows. First, liquid resin (stage A), which is thermosetting resin, and inorganic filler, which is to be mixed with the liquid resin, are prepared. The resin used herein contains, as its main component, at least one kind selected from a group including epoxy resin, phenol resin, melamine resin, and polyimide resin. Preferably, the resin contains epoxy resin as its main component. For example, inorganic material containing, as its main component, at least one kind selected from a group including aluminum oxide, aluminum nitride, silicon nitride, and boron nitride is used as the inorganic filler. Next, the liquid (stage A) thermosetting resin and the inorganic filler are mixed, and coating is performed such that the resultant material is shaped in a sheet. Next, the sheet material is heated until it reaches a semi-cured state (stage B). In this way, the insulating sheet 70 is manufactured. Alternatively, the insulating sheet 70 may be manufactured by first heating the liquid (stage A) thermosetting resin, which has been mixed with the inorganic filler, until it reaches a semi-cured state (stage B) and by next shaping the semi-cured thermosetting resin into a sheet. The heating or warming time in this case is suitably set based on a takt time and depending on the kind of the catalyst of the resin. For example, the heating temperature is between 100° C. and 200° C., inclusive.

The molding resin raw material 62 is powder or a tablet containing semi-cured (stage B) thermosetting resin and inorganic filler. For example, the molding resin raw material 62 is manufactured as follows. First, liquid resin (stage A), which is thermosetting resin, and inorganic filler, which is to be mixed with the liquid resin, are prepared. The resin used herein contains, as its main component, at least one kind selected from a group including epoxy resin, phenol resin, and melamine resin. Preferably, the resin contains epoxy resin as its main component. In addition, inorganic material containing silicon oxide as its main component is used as the inorganic filler. Next, the inorganic filler is mixed with the liquid resin. By heating the liquid resin (stage A) mixed with the inorganic filler, semi-cured raw material (stage B) is made. The heating or warming time in this case is suitably set based on a takt time and depending on the kind of the catalyst of the resin. For example, the heating temperature is between 100° C. and 200° C., inclusive. The semi-cured raw material is made into powder, and this powder is made into, for example, a tablet. In this way, the molding resin raw material 62 is manufactured.

Next, an attachment step of attaching the semi-cured insulating sheet to the rear surface of an area corresponding to the main die pads 44a to 47a of the main current lead frames 44 to 47 included in the metal plate is performed (step S2 in FIG. 5). In this step, the semi-cured insulating sheet may be attached to the above rear surface by pressing of a pressing apparatus. A pressing machine may be used as the pressing apparatus. By heating and pressing the semi-cured insulating sheet 70 in its softened state, the semi-cured insulating sheet 70 and the above rear surface are tightly attached to each other. Next, the semi-cured insulating sheet 70 is removed from the pressing apparatus. As a result, the main current lead frames 40 to which the semi-cured insulating sheet 70 has been tightly attached are formed.

Next, a mounting step of mounting and wiring the semiconductor chips 21 to 24, the control ICs 50h and 50l, and the electronic parts 51a to 51c on the main current lead frames 40 and the control lead frames 30 included in the metal plate is performed (step S3 in FIG. 5). In this step, as illustrated in FIG. 6, first, the semiconductor chips 21 to 24 (a semiconductor chip 21 is illustrated in FIG. 6) are soldered to the main die pads 44a to 47a (the main die pad 47a is illustrated in FIG. 6) of the main current lead frames 44 to 47 (parts of the main current lead frames 47 and 46 are illustrated in FIG. 6). The control ICs 50h and 50l (the control IC 50h is illustrated in FIG. 6) are soldered to the control die pads 38a1 and 38a2 of the control lead frame 38, respectively. The electronic parts 51a, 51b, and 51c (the electronic parts 51c is illustrated in FIG. 6) are soldered to the control die pads 31a, 33a, and 35a of the control lead frames 31, 33, and 35, respectively. The above bonding may be performed by using sintering using sintered material or resin such as adhesive agent, in place of solder.

Next, these components are conveyed to a predetermined bonding apparatus that performs wire bonding and are wired. For example, the main current lead frames 40 on which the semiconductor chips 21 to 24 are disposed and the control lead frames 30 on which the control ICs 50h and 50l are disposed are suitably electrically connected to each other by using the main current wires 22e and the control wires 22b and 22c.

In particular, later, the gate electrodes of the semiconductor chips 21 arranged along inlets 84a to 84f are connected to the front surface electrodes of the control IC 50h via the control wires 22b. Likewise, the gate electrodes of the semiconductor chips 22 to 24 are connected to the front surface electrodes of the control IC 50l via the control wires 22c. In addition, the front surface electrodes of the control IC 50h are connected to the control lead frames 31 to 36 and 38 (control terminal 38b1) via the control wires 22a. The control lead frames 31, 33, and 35 are connected to the corresponding control wires 22a via the electronic parts 51a to 51c. The front surface electrodes of the control IC 50l are connected to control lead frames 30 (including the control terminal 38b2, except the control lead frames 31 to 37 and 38 (control terminal 38b1)) via the control wires 22d.

The control wires 22c (control wires 22c1 and 22c3) extending as described above directly connect the control IC 50l and the semiconductor chips 24 and 22 over the gaps among the main die pads 44a to 46a, seen in the Y direction from the main current lead frames 44 to 47 (see FIG. 9). As described above, the main current lead frames 44 to 47 have steps, and the semiconductor chips 21 to 24 are disposed at a lower level than the control ICs 50h and 50l. Thus, since the loops of the control wires 22b and 22c, which connect the semiconductor chips 21 to 24 and the control ICs 50h and 50l, are larger than those of the control wires 22a and 22d. Thus, the individual control wire 22b is longer than the actual distance between a corresponding semiconductor chip 21 and the control IC 50h. Likewise, the individual control wire 22c is longer than the actual distance between a corresponding one of the semiconductor chips 22 to 24 and the control IC 50l.

Next, for example, as illustrated in FIGS. 7 and 8, a placement step of setting the metal plate, on which the semiconductor chips 21 to 24, the control ICs 50h and 50l, and the electronic parts 51a to 51c have been mounted and to which the insulating sheet 70 has been attached, in the mold 80 is performed (step S4 in FIG. 5). The metal plate including the main current lead frames 40 and the control lead frames 30 is conveyed into a molding apparatus that performs molding and is disposed in a lower mold 82 of the mold 80. In this step, the semi-cured insulating sheet 70 and the main die pads 44a to 47a (the main die pad 47a is illustrated in FIG. 7) are disposed in this order on an inner bottom surface of the lower mold 82. Next, the molding apparatus sandwiches the main current lead frames 40 and the control lead frames 30 between the upper mold 81 and the lower mold 82 of the mold 80. The mold 80 includes the cavity 83. This cavity 83 has a rectangular shape in plan view and is surrounded by one long side 80a, one short side 80b, the other long side 80c, and the other short side 80d in this order. As illustrated in FIG. 8, the long side 80a is formed in the −Y direction, the short side 80b is formed in the −X direction, the long side 80c is formed in the +Y direction, and the short side 80d is formed in the +X direction. The mold 80 has corners C1 to C4 in plan view. The corner C1 is formed by the long side 80*a* and the short side 80*b*, and the corner C2 is formed by the short side 80*b* and the long side 80*c*. The corner C3 is formed by the long side 80*c* and the short side 80*d*, and the corner C4 is formed by the short side 80*d* and the long side 80*a*.

In addition, the lower mold 82 has mold step parts 82*e* and 82*f* along the long sides 80*a* and 80*c* between the short sides 80*b* and 80*d*. It is preferable that the mold step parts 82*e* and 82*f* have a height (depth), for example, approximately the same as or larger than a sum of the thickness of the insulating sheet 70 and the thickness of any one of the main die pads 44*a* to 47*a*.

In addition, the mold 80 includes the inlets 84*a* to 84*f*, gates 85*a* to 85*f*, a plurality of control pins 87*a* to 87*e*, and pressing parts 86*a* and 86*b*. When the control pins 87*a* to 87*e* do not particularly need to be distinguished from each other, any one of the control pins 87*a* to 87*e* will be referred to as a control pin 87. The inlets 84*a* to 84*f* communicate with the cavity 83, and each inlet is formed between two neighboring main current lead frames 40 on the long side 80*a* of the cavity 83. In addition, the inlets 84*a* to 84*f* are arranged in a line along the plurality of main current lead frames 40. In FIG. 8, each of the inlets 84*a* to 84*f* is formed between two neighboring main current lead frames among the main current lead frames 41 to 47. That is, when seven main current lead frames 40 are formed, six inlets 84*a* to 84*f* are formed. The number and size of the inlets 84*a* to 84*f* illustrated in FIG. 8 are only examples. As long as the inlets are formed along the long side 80*a* of the cavity 83, the number and size of the inlets are not limited to the above examples.

The gates 85*a* to 85*f* connect runners, with which a pot containing the molding resin raw material is provided, and the inlets 84*a* to 84*f*. The gates 85*a* to 85*f* are used for injection of the molding resin raw material, which has flowed through the runners, into the cavity 83 through the inlets 84*a* to 84*f*.

For example, the control pins 87 each have a cylindrical shape, are movable vertically (±Z directions) in the top surface of the upper mold 81 of the mold 80, and are formed along the long sides 80*a* and 80*c*. In addition, the control pins 87 are formed between the inlets 84*a* to 84*f* and the plurality of control wires 22*c* and 22*b* and are formed in the upper mold 81 on a line connecting the inlets 84*a* to 84*f* and the plurality of control wires 22*c* and 22*b* in plan view. Specifically, it is preferable that the individual control pin 87 be disposed between two neighboring main die pads among the plurality of main die pads 44*a* to 47*a* or be disposed over the gap between the two neighboring main die pads in plan view. It is more preferable that the individual control pin 87 be disposed between two neighboring semiconductor chips among the semiconductor chips 21 to 24 or be disposed over the gap between the two neighboring semiconductor chips in plan view. For example, as illustrated in FIG. 9, a control pin 87 is disposed over the gap between the main die pads 44*a* and 45*a*, a control pin 87 is disposed over the gap between the main die pads 45*a* and 46*a*, and a control pin 87 is disposed over the gap between the main die pads 46*a* and 47*a*. A control pin 87 is disposed over the gap between the semiconductor chips 24 and 23, a control pin 87 is disposed over the gap between the semiconductor chips 23 and 22, and a control pin 87 is disposed over the gap between the semiconductor chips 22 and 21. In addition, a control pin 87 is disposed over the gap between two neighboring semiconductor chips 21.

In addition, the lower ends of the control pins 87 are located lower than the control lead frames 30 and away from the front surfaces of the semiconductor chips 21 to 24. That is, as illustrated in FIG. 9, the lower end of the control pin 87*a* is disposed away from the semiconductor chips 24 and 23 without coming into contact therewith. Likewise, the lower ends of the control pins 87*b* to 87*e* are disposed away from the semiconductor chips 23, 22, and 21 without coming into contact therewith. Thus, it is possible to prevent the main die pads 44*a* to 47*a* and the semiconductor chips 24, 23, 22, and 21 from being damaged. In addition, each of the control wires 22*c*1 to 22*c*3 and 22*b*1 to 22*b*6 connects to a corresponding one of the semiconductor chips 21 to 24 while forming a loop. The lower end of each control pin 87 is located at a height corresponding to 30% to 80%, inclusive, of the height from the top of the loop of the corresponding one of the control wires 22*c*1 to 22*c*3 and 22*b*1 to 22*b*6 to the connection point of the corresponding semiconductor chip. In addition, the control pins 87 are made of material having high mold releasability from the molding resin raw material injected into the cavity 83 as will be described below. Alternatively, such material may be applied to the surfaces of the control pins 87. Preferably, the control pins 87 are made of material including the same material as that of the upper mold 81.

The pressing parts (the pressing parts 86*a* and 86*b* in FIG. 7) are formed in the upper mold 81 at four corners of the insulating sheet 70 in plan view. Any number of pressing parts may be formed as long as some of the pressing parts correspond to outer edge portions of the insulating sheet 70. In addition, the pressing parts are formed vertically movably (±Z directions) in FIG. 7 in the upper mold 81. The pressing parts may be pressed perpendicularly to the front surface of the lower mold 82. Each of the plurality of pressing parts may be a cylindrical or prismatic pin. As will be described below, it is preferable that the pressing parts each have a shape that enables pressing of the insulating sheet 70 and that does not prevent injection of the molding resin raw material. To this end, for example, the pressing parts are formed as thin as possible. The plurality of pressing parts are also made of material having high mold releasability from the molding resin raw material injected into the cavity 83 as will be described below. Alternatively, such material may be applied to the surfaces of the pressing parts. Preferably, the pressing parts are made of material including the same material as that of the upper mold 81.

In this way, the plurality of main current lead frames 40 and the plurality of control lead frames 30 are set in the cavity 83 covered by the lower mold 82 and the upper mold 81 including the control pins 87, etc.

In the above steps S1 to S4, the mounting step in step S3 may be performed before the attachment step in step S2. Alternatively, the attachment step in step S2 may be performed during the mounting step in step S3. In this case, after the soldering of the semiconductor chips 21 to 24, the control ICs 50*h* and 50*l*, and the electronic parts 51*a* to 51*c* in step S3, the attachment step in step S2 may be performed, and the remaining wiring in the mounting step in step S3 may be performed.

In addition, in the above steps S1 to S4, after the preparation step in step S1, the mounting step in step S3 may be performed without performing the attachment step in step S2. Next, the semi-cured insulating sheet 70 may be disposed in the lower mold 82, and the semiconductor chips 21 to 24, the control ICs 50*h* and 50*l*, and the electronic parts 51*a* to 51*c* may be disposed on the semi-cured insulating sheet 70. Next, the plurality of main current lead frames 40 and the plurality of control lead frames 30, which have been wired, may be disposed. Specifically, in the placement step in step S4, first, the insulating sheet 70 is disposed on the inner bottom surface of the lower mold 82 such that the rear surface of the insulating sheet 70 comes into contact with the inner bottom surface of the lower mold 82. Next, the main die pads are disposed on the front surface of the insulating sheet 70 such that the rear surfaces of the main die pads come into contact with the front surface of the insulating sheet 70. In this way, the attachment step in step S2 is simultaneously performed in the placement step in step S4.

Next, a molding step of injecting the liquid molding resin raw material 62 into the mold 80 to achieve molding is performed (step S5 in FIG. 5). First, as illustrated in FIG. 7, the semi-cured insulating sheet 70 is pressed in the direction of the inner bottom surface of the lower mold 82 by using the plurality of pressing parts (pressing parts 86a and 86b in FIG. 7), and this state is maintained. In this way, the insulating sheet 70 is certainly pressed.

Next, a tablet semi-cured (stage B) molding resin raw material 62 is set in the pot of the molding apparatus. Next, this molding resin raw material 62 is heated and softened. Next, pressure is applied to the softened semi-cured molding resin raw material, which is next injected into the cavity 83 from the gates 85a to 85f. The upper mold 81 and the lower mold 82 are heated in advance, and the cavity 83 is filled with the softened semi-cured molding resin raw material 62.

Figure 10:
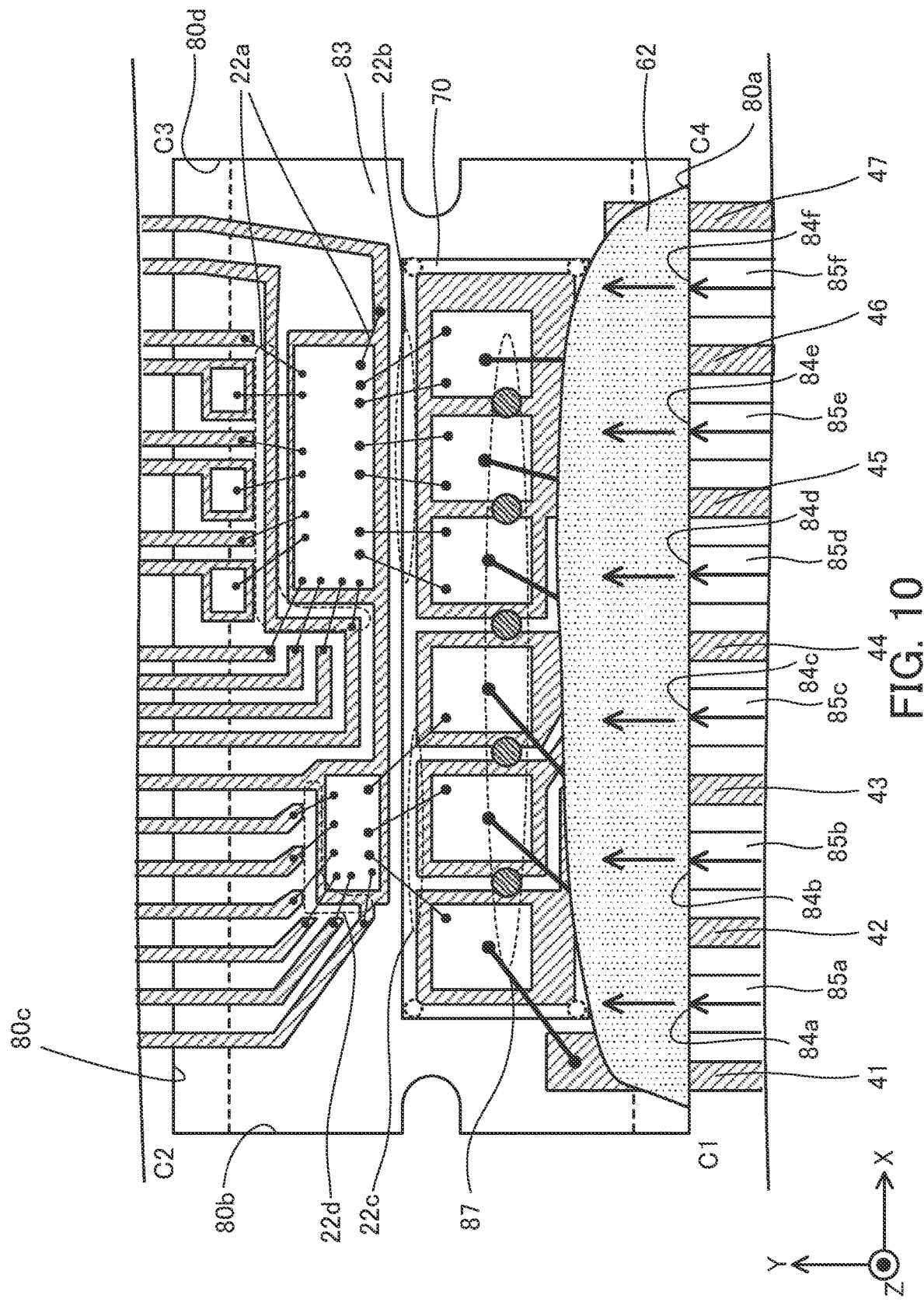
FIG. 10 is a plan view (part 1) illustrating a molding step included in the semiconductor device manufacturing method according to the first embodiment.

Next, the injection of the softened semi-cured molding resin raw material 62 into the cavity 83 will be described in detail. When the molding resin raw material 62 inside the pot (not illustrated) is pressed, the molding resin raw material 62 flows into the gates 85a to 85f through the runners communicating with the pot. The semi-cured molding resin raw material 62 that flows into the gates 85a to 85f is injected almost simultaneously into the cavity 83 from the six inlets 84a to 84f, as illustrated in FIG. 10. The molding resin raw material 62 is injected perpendicularly (+Y direction) to the long side 80a from the six inlets 84a to 84f. In addition, certain amounts of molding resin raw material 62 are injected from the individual inlets 84a to 84f almost simultaneously per unit time. Thus, in plan view, the molding resin raw material 62 spreads inside the cavity 83 from the six inlets 84a to 84f in the same way toward the insulating sheet 70 on which the main die pads 44a to 47a are disposed.

As described above, the main current lead frames 44 to 47 include steps formed by the linkage parts 44b to 47b. The molding resin raw material 62 is injected through the six inlets 84a to 84f, and the cavity 83 deepens at the mold step parts 82e and 82f (the length in the −Z direction increases). Thus, the flow velocity of the molding resin raw material 62 flowing on the inner bottom surface of the lower mold 82 drops.

In addition, the flow velocity of the molding resin raw material 62 flowing toward (+Y direction) the long side 80c inside the cavity 83 drops in areas near the inner top surface (the inner top surface of the upper mold 81) and the inner bottom surface (the inner bottom surface of the lower mold 82) of the mold 80 due to the shear stress. On the other hand, in areas (center parts) away from the upper mold 81 and the lower mold 82, the flow velocity of the molding resin raw material 62 rises. In particular, when the molding resin raw material 62 flows through narrow gaps among the main die pads 44a to 47a, high pressure is needed. Thus, the flow velocity of the molding resin raw material 62 flowing through these gaps rises. That is, the locations of the control wires 22c and 22b correspond to the locations where the flow velocity of the molding resin raw material 62 rises. In addition, some of the control wires 22c1 to 22c3 and 22b1 to 22b6 extend over some of the gaps among the main die pads 44a to 47a, as illustrated in FIG. 9. Thus, if the mold 80 does not include the control pins 87, after the flow velocity has risen, the molding resin raw material 62 directly runs into the control wires 22c and 22b. In particular, the control wires 22c and 22b each have a diameter thinner than that of the main current wires 22e. Thus, the control wires 22c and 22b are easily deformed when the molding resin raw material 62 directly runs into the control wires 22c and 22b. In addition, the bonding force of the control wires 22c and 22b with respect to their respective bonding targets is less than that of the main current wires 22e. Thus, the portions where the control wires 22c and 22b are bonded are easily peeled off. When the molding resin raw material 62 whose flow velocity has risen flows toward the long side 80c, the control wires 22d and 22a could also be damaged, as is the case with the control wires 22c and 22b.

Thus, the control pins 87 are arranged in the gaps among the main die pads 44a to 47a or the gaps among the semiconductor chips 21 to 24. In this way, as illustrated in FIG. 11, after the molding resin raw material 62 flows and runs into any one of the control pins 87, the molding resin raw material 62 is divided into two directions (±X directions). As a result, as illustrated in FIGS. 12 and 13, the flow velocity of the molding resin raw material 62 on the rear side of the individual control pin 87 (in the direction of the long side 80c) is dropped. Thus, it is possible to prevent the molding resin raw material 62 from deforming the control wires 22c and 22b and from peeling off the control wires 22c and 22b at their respective bonding locations. It is also possible to prevent occurrence of damage to the control wires 22d and 22a.

Figure 14:
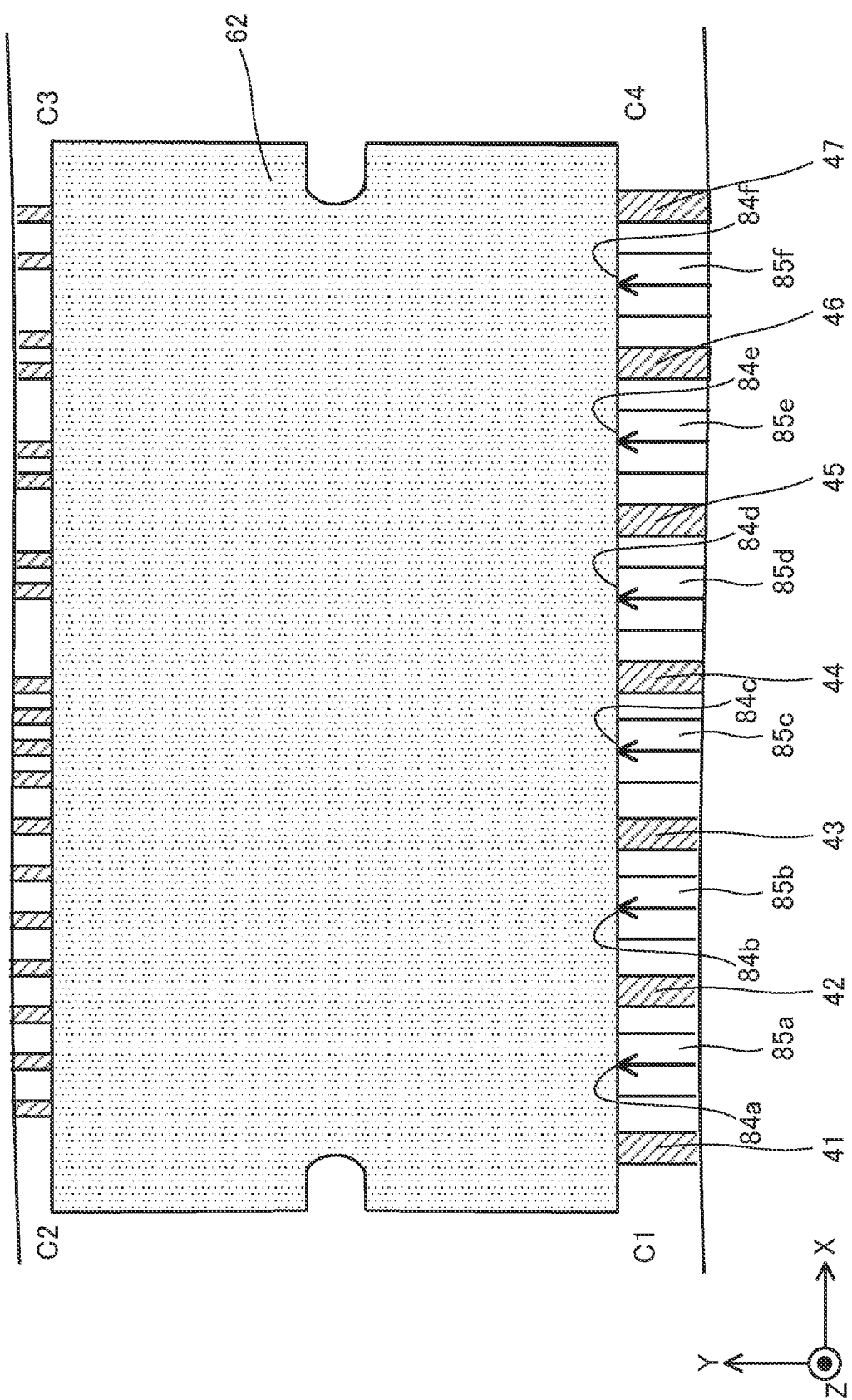
FIG. 14 a plan view (part 4) illustrating the molding step included in the semiconductor device manufacturing method according to the first embodiment.

In this way, the molding resin raw material 62 spreads to the short sides 80b and 80d, reaches the long side 80c, and fills the cavity 83, as illustrated in FIG. 14. Next, the filling pressure of the molding resin raw material 62 is set to a certain level, and voids, etc. inside the molding resin raw material 62 are removed. Next, the pressing parts (the pressing parts 86a and 86b in FIG. 7) are moved in the upward direction (+Z direction) of the mold 80 to release the pressing on the main die pads 44a to 47a. The control pins 87 are also moved in the upper direction (+Z direction) of the mold 80.

Next, the injection of the molding resin raw material 62 is stopped, the mold 80 is opened, and the semi-cured molded body is extracted from the mold 80. This semi-cured molded body is obtained by sealing the semiconductor chips 21 to 24, the main current lead frames 40, the control lead frames 30, the semi-cured insulating sheet 70, etc. with the semi-cured molding resin raw material 62. The rear surface of the semi-cured insulating sheet 70 is exposed to the outside such that the rear surface of the semi-cured insulating sheet 70 are on the same plane with the rear surface of the molded body. In addition, after the pressing parts and the control pins 87 are pulled upward, the concave portions 60b1 and 60b2 are formed at the locations, where the pressing parts and the control pins 87 have been located, on the front surface of the molding resin raw material 62 (see FIG. 1B). Convex portions may be formed at the locations, where the pressing parts and the control pins 87 have been located, on the front surface of the molding resin raw material 62.

Next, a curing step is performed (step S6 in FIG. 5). First, the semi-cured molded body extracted from the molding apparatus is conveyed to a heating apparatus. Next, the semi-cured molded body conveyed to the heating apparatus is heated at a predetermined temperature. The heating temperature is between 120° C. and 180° C., inclusive. The molded body is consequently cured. The molding resin extending from the inlets 84a to 84f is cut off from the molded body. As a result, the inlets 84a to 84f become the injection cut-off surfaces 60c. The injection cut-off surfaces 60c are coarser and more radiant than their surrounding surfaces. In the present curing step, after the semi-cured molded body is extracted from the mold 80, the semi-cured molded body is conveyed to the heating apparatus and is heated at a predetermined temperature in the heating apparatus. However, alternatively, the molded body may be cured inside the mold 80 by maintaining the molded body at a predetermined temperature for a predetermined time.

Thus, the semiconductor device 10, which is illustrated in FIGS. 1 to 4 and includes the cured molding resin 60, is manufactured. After or before the curing step (step S6 in FIG. 5), components that are not needed, such as the tie bar, may be removed from the metal plate including the components corresponding to the main current lead frames 40 and the control lead frames 30. In addition, the terminal portions of the main current lead frames 40 and the control terminals of the control lead frames 30 may be bent.

In addition, the pressing parts and the control pins 87 may be pulled off upward after the molding resin raw material 62 is cured to the molding resin 60. In this case, tubular holes corresponding to the pressing parts and the control pins 87 are formed at the locations where the pressing parts and the control pins 87 have been pulled off. Molding resin material may separately be injected into the holes and cured, to fill the holes with the molding resin material.

The above manufacturing method of the semiconductor device 10 includes a step of preparing components of the semiconductor device 10 and a mounting step of disposing the semiconductor chips 24 to 21 on the main die pads 44a to 47a and the control ICs 50h and 50l on the control die pads 38a1 and 38a2. In addition, regarding the control lead frames 30 and the main current lead frames 40 disposed in the mold 80, at least one of the control wires 22a to 22d is directly connected to at least one of the electrodes of the control ICs 50h and 50l, the control electrodes of the semiconductor chips 21 to 24, the electrodes of the electronic parts 51a to 51c, and the control lead frames 30, and in plan view, the semiconductor chips 21 to 24, the control ICs 50h and 50l, and the electronic parts 51a to 51c are stored in the cavity 83. In addition, the manufacturing method includes a molding step of disposing the control pins 87 between the inlets 84a to 84f and the control wires 22c and 22b and on a line connecting the inlets 84a to 84f and the control wires 22c and 22b in plan view, injecting the molding resin raw material 62 into the cavity 83 through the inlets 84a to 84f, and filling the cavity 83 with the molding resin raw material 62, to fill the semiconductor chips 21 to 24 and the control ICs 50h and 50l disposed on the main current lead frames 40 and the control lead frames 30. In this way, the flow velocity of the molding resin raw material 62 flowing toward the control wires 22c and 22b is reduced. Thus, it is possible to prevent the deformation of the control wires 22c and 22b and the peeling of the control wires 22c and 22b from their respective wiring targets. Thus, deterioration of the reliability of the semiconductor device 10 is prevented.

As described above, the control pins 87 control the direction of the flow of the molding resin raw material 62 and reduce the flow velocity of the molding resin raw material 62 flowing straight. Next, the arrangement of the control pins 87 will be described with reference to FIG. 15.

Figure 15:
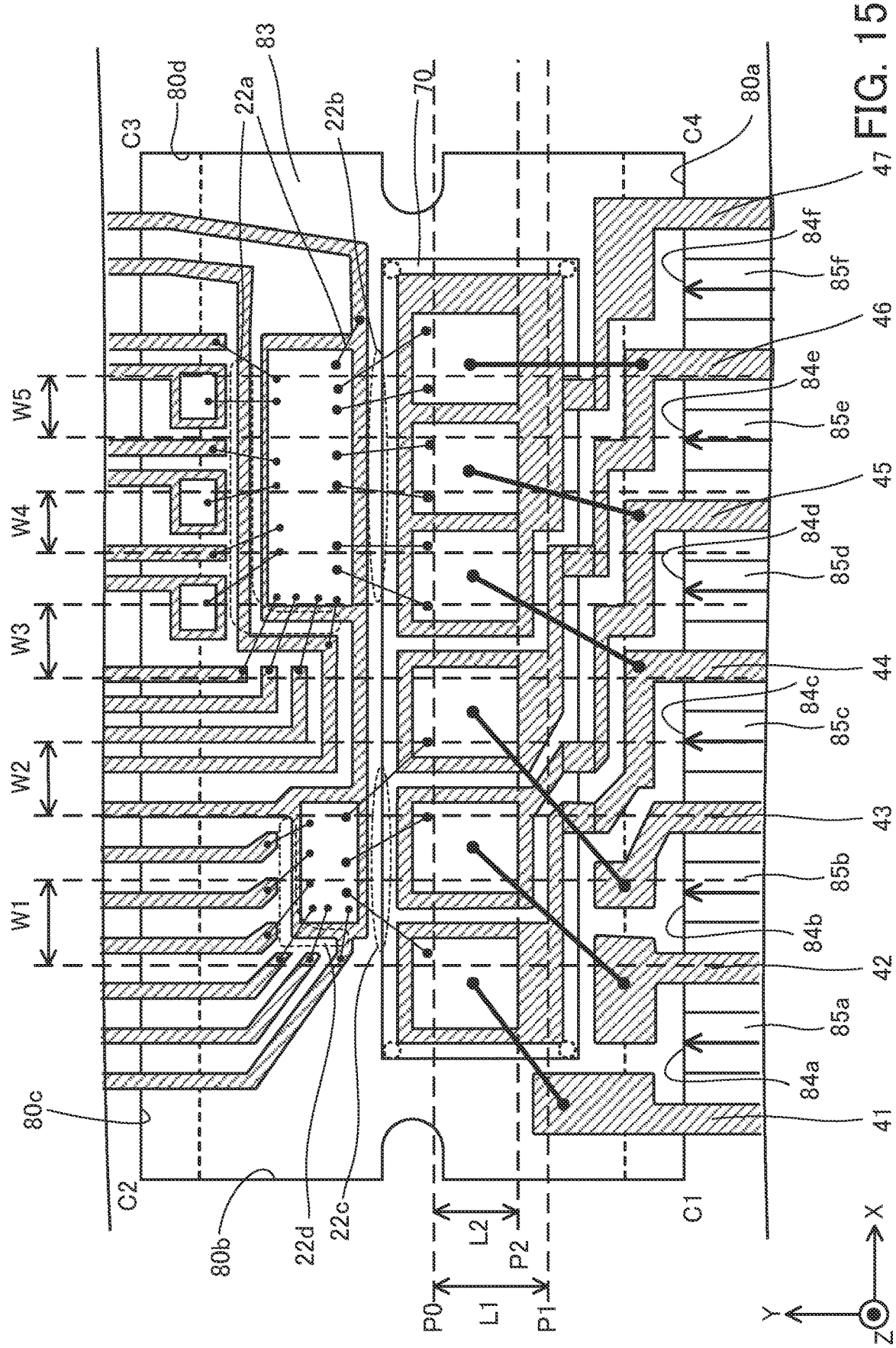
FIG. 15 is a plan view illustrating mounting of control pins included in the semiconductor device manufacturing method according to the first embodiment.

FIG. 15 is a plan view illustrating arrangement of the control pins included in the semiconductor device manufacturing method according to the first embodiment. See, for example, FIG. 3 about the reference characters of the components in FIG. 15.

As described above, the flow velocity of the molding resin raw material 62 rises in the gaps among the main die pads 44a to 47a and the gaps among the semiconductor chips 21 to 24. The control wires 22c and 22b extending over these gaps and disposed downstream (+Y direction) of the flow of the molding resin raw material 62 and the further downstream control wires 22d and 22a are easily damaged by the flow of the molding resin raw material 62. To drop the flow velocity of the molding resin raw material 62, first, the control pins 87 are disposed between the control wires 22c and 22b and the inlets 84a to 84f and on a line between the control wires 22c and 22d and the inlets 84a to 84f in plan view. That is, regarding the ±X directions, the control pins 87 are disposed in the gaps among the main die pads 44a to 47a and the gaps among the semiconductor chips 21 to 24 (in areas W1 to W5 in FIG. 15). In addition, regarding the ±Y directions, the control pins 87 are disposed in an area from a line P0 in FIG. 15 in the −Y direction.

If the control pins 87 are disposed too close to the inlets 84a to 84f, the molding resin raw material 62 whose flow has been divided by the control pins 87 merges together after the control pins 87. Consequently, the merged molding resin raw material 62 could damage the control wires 22c and 22b and the control wires 22a and 22d. Thus, it is preferable that the control pins 87 be suitably away from the inlets 84a to 84f and disposed in an area L1 (from the line P0 to a line P1) in FIG. 15. That is, the area L1 is from the bonding locations (line P0) of the control wires 22c and 22b to end portions (line P1) of the main die pads 44a to 47a in the direction of the long side 80a. More preferably, the control pins 87 are disposed in an area L2 (from the line P0 to a line P2) in FIG. 15. That is, the area L2 is from the bonding locations (line P0) of the control wires 22c and 22b to end portions (line P2) of the semiconductor chips 21 to 24 in the direction of the long side 80a. Still more preferably, by disposing the control pins 87 on the line P0, the flow of the molding resin raw material 62 is controlled without fail.

(Variation)

Figure 16:
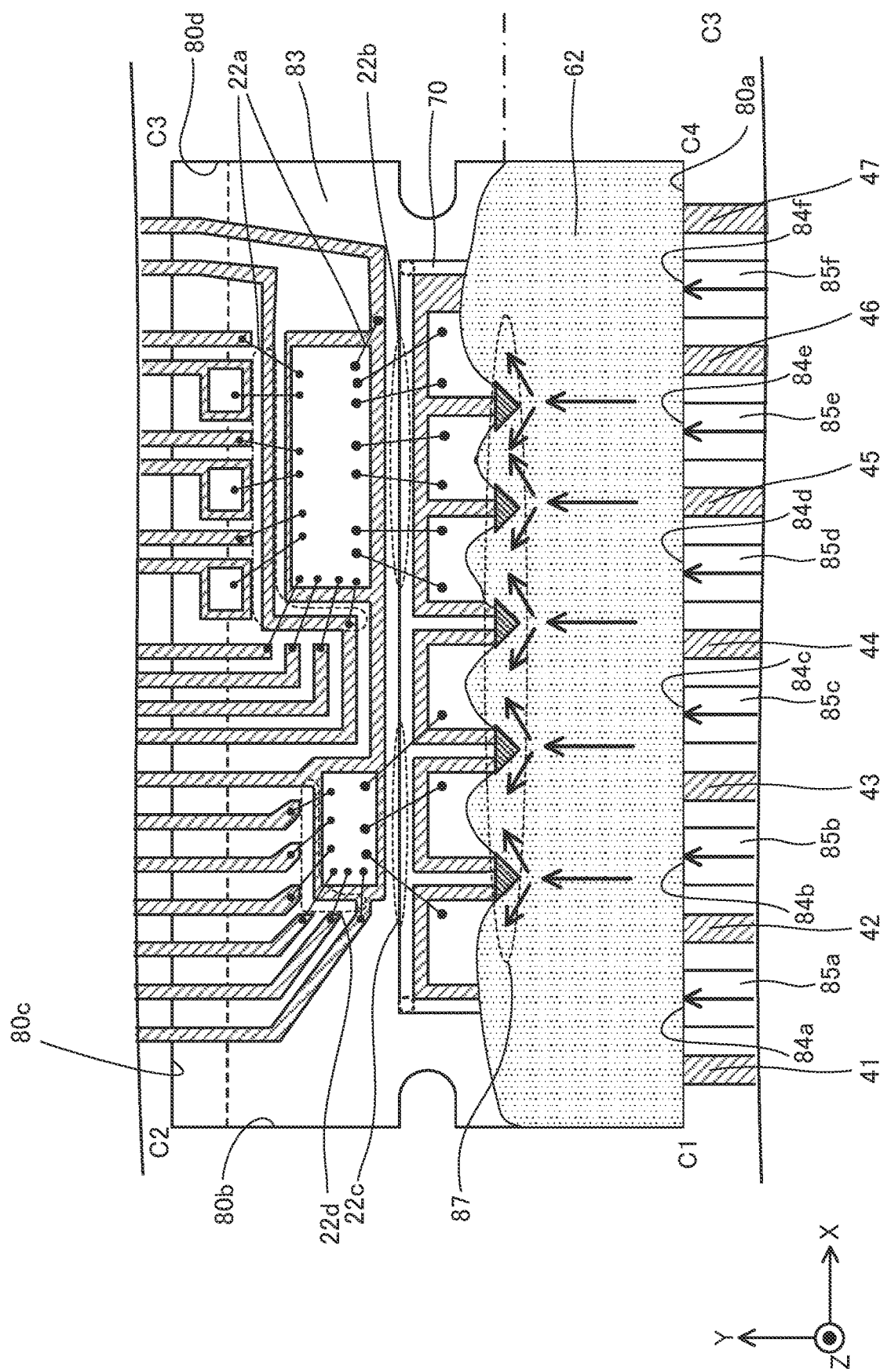
FIG. 16 is a plan view illustrating the molding step included in the semiconductor device manufacturing method according a variation of the first embodiment.

Next, control pins 87 that reduce the flow velocity of the molding resin raw material 62 more reliably will be described with reference to FIG. 16. FIG. 16 is a plan view illustrating a molding step included in a semiconductor device manufacturing method according to a variation of the first embodiment. Each of the control pins 87 according to the variation has a columnar shape and has a polygonal cross section. These control pins 87 are disposed in their respective areas described with reference to FIG. 15, and one of the plurality of corners of each control pin 87 faces the long side 80a (the inlets 84a to 84f).

In the example illustrated in FIG. 16, the control pins 87 is each shaped in a triangular prism. Specifically, the cross section of each control pin 87 is an isosceles triangle. The vertex angle of each control pin 87 faces the inlets 84a to 84f. In this case, two equal sides having the same length suitably divide the flow of the molding resin raw material 62 into two directions. Thus, the flow velocity of the molding resin raw material 62 flowing straight is dropped without fail. In this case, it is possible to suitably control the direction of the molding resin raw material 62 and reduce the flow velocity thereof by optimizing the vertex angle of each control pin 87.

Second Embodiment

Figure 17:
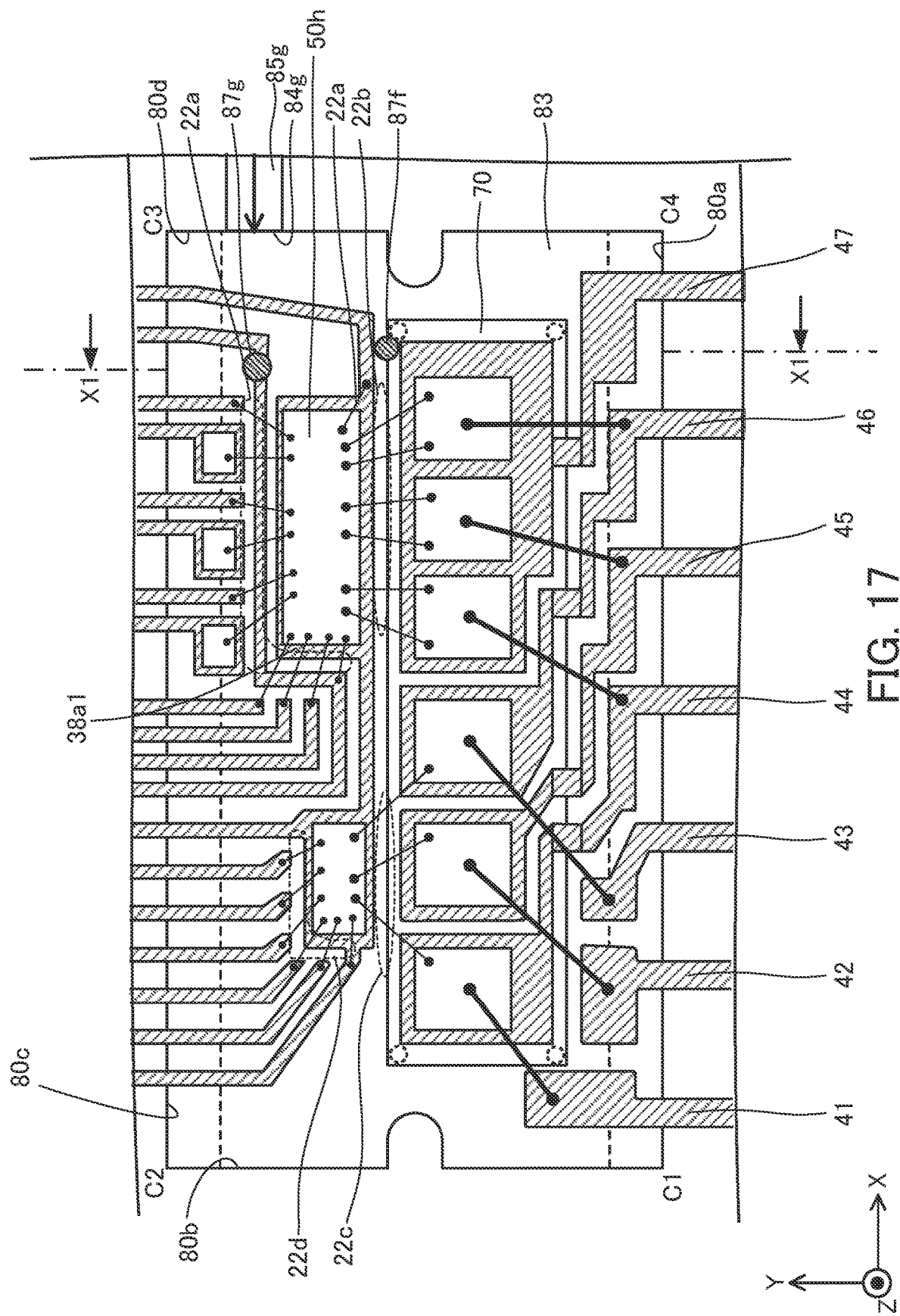
FIG. 17 is a plan view illustrating a placement step included in a semiconductor device manufacturing method according to a second embodiment.
Figure 18:
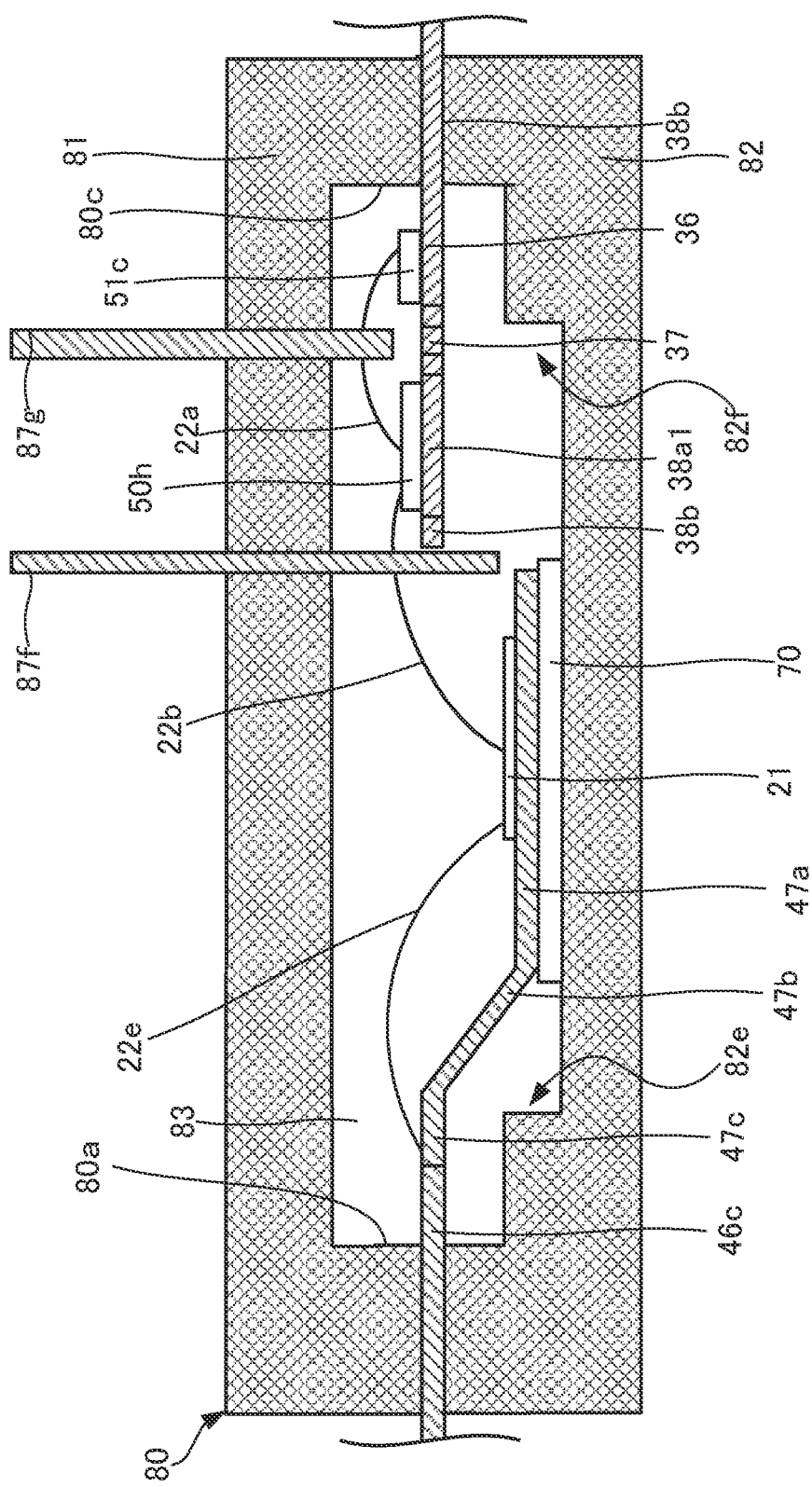
FIG. 18 is a sectional view illustrating the placement step included in the semiconductor device manufacturing method according to the second embodiment.
Figure 19:
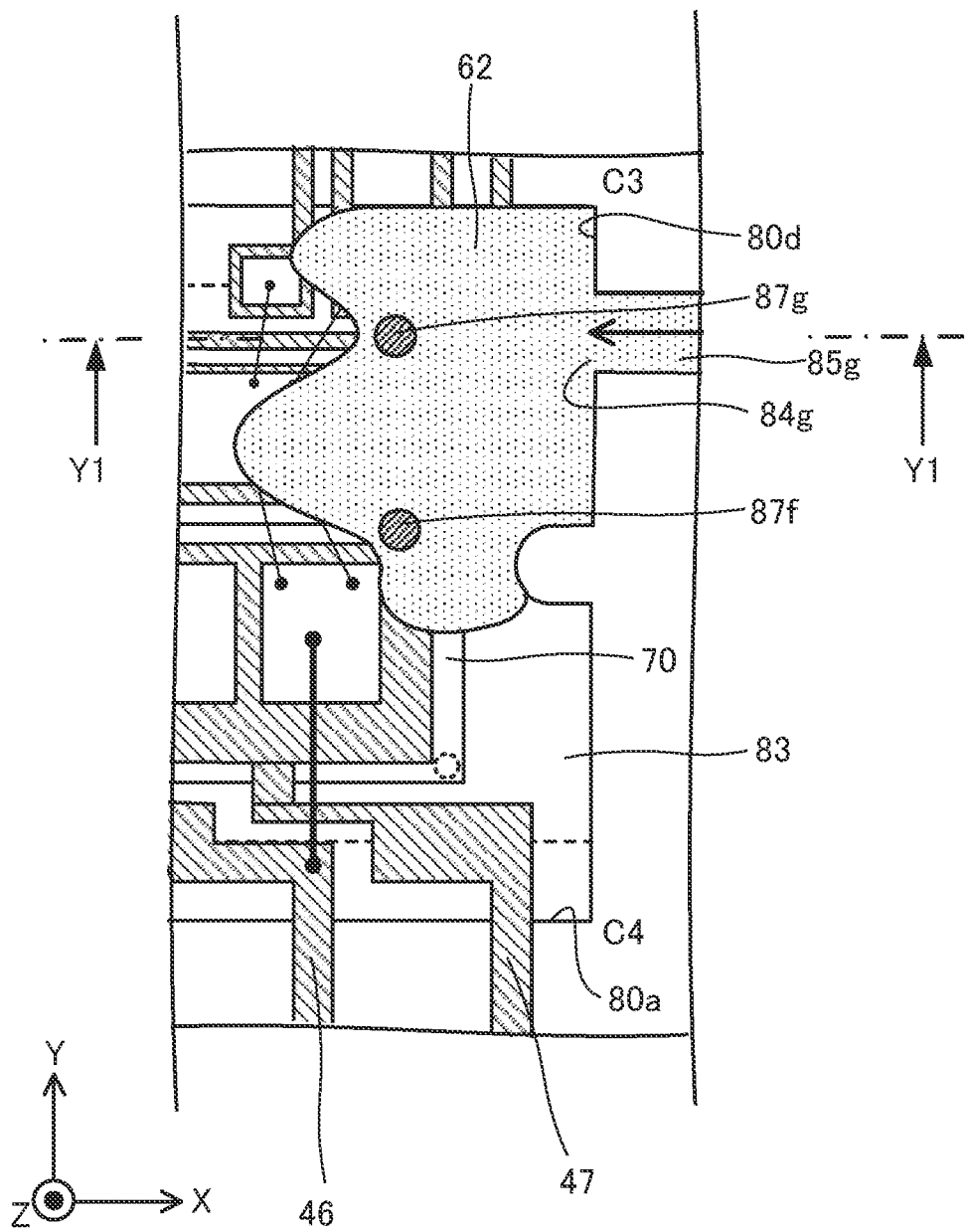
FIG. 19 is a plan view illustrating a molding step included in the semiconductor device manufacturing method according to the second embodiment.
Figure 20:
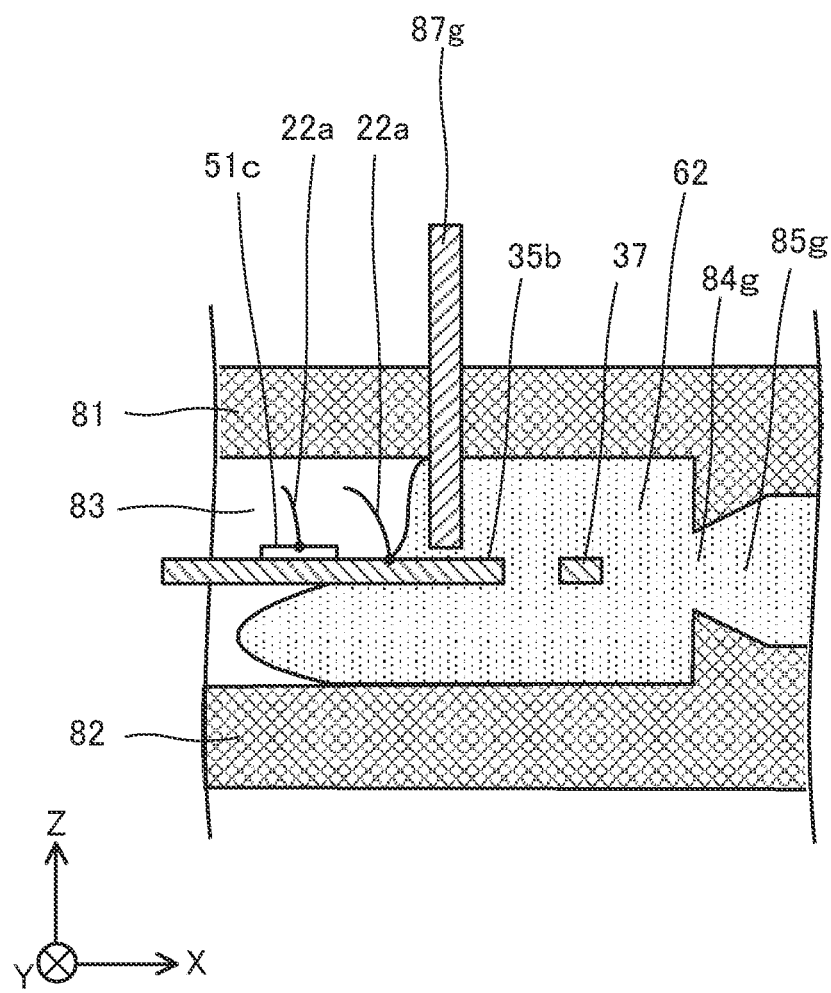
FIG. 20 is a sectional view illustrating the molding step included in the semiconductor device manufacturing method according to the second embodiment.

According to the first embodiment, the molding resin raw material 62 is injected from the long side 80*a*. However, according to a second embodiment, molding resin raw material 62 is injected from an area on a short side 80*d*, the area being near control lead frames 30. A manufacturing method of a semiconductor device 10 according to the second embodiment will be described with reference to FIGS. 17 to 20 and FIG. 5. FIG. 17 is a plan view of a placement step included in the semiconductor device manufacturing method according to the second embodiment. FIG. 18 is a sectional view illustrating the placement step included in the semiconductor device manufacturing method according to the second embodiment. FIG. 19 is a plan view illustrating a molding step included in the semiconductor device manufacturing method according to the second embodiment. FIG. 20 is a sectional view illustrating the molding step included in the semiconductor device manufacturing method according to the second embodiment. FIG. 18 is a sectional view taken along a dashed-dotted line X1-X1 in FIG. 17, and FIG. 20 is a sectional view taken along a dashed-dotted line Y1-Y1 in FIG. 19. In the second embodiment, the same components as those in the first embodiment will be denoted by the same reference characters.

The semiconductor device 10 according to the second embodiment is also manufactured in accordance with the flowchart in FIG. 5. To manufacture the semiconductor device 10, first, a preparation step of preparing components of the semiconductor device 10 is performed (step S1 in FIG. 5). Next, an attachment step of attaching a semi-cured insulating sheet 70 to the rear surface of the area corresponding to main die pads 44*a* to 47*a* of main current lead frames 44 to 47 included in a metal plate is performed (step S2 in FIG. 5). Next, a mounting step of disposing semiconductor chips 21 to 24, control ICs 50*h* and 50*l*, and electronic parts 51*a* to 51*c* on main current lead frames 40 and the control lead frames 30 included in the metal plate and performing wiring is performed (step S3 in FIG. 5).

In particular, later, along an inlet 84*g*, front surface electrodes of the control IC 50*h* and control lead frames 31 to 36 are connected to each other via control wires 22*a*. The control lead frames 31, 33, and 35 are connected to some of the control wires 22*a* via the electronic parts 51*a* to 51*c*. Front surface electrodes of the control IC 50*l* and control lead frames 30 (except the control lead frames 31 to 36) are connected to each other via control wires 22*d*. Likewise, the gate electrodes of the semiconductor chips 21 and the front surface electrodes of the control IC 50*h* are connected to each other via control wires 22*b*. In addition, the gate electrodes of the semiconductor chips 22 to 24 are connected to front surface electrodes of the control IC 50*l* via control wires 22*c*.

Next, a placement step of setting the metal plate, on which the semiconductor chips 21 to 24, the control ICs 50*h* and 50*l*, and the electronic parts 51*a* to 51*c* have been mounted and to which the insulating sheet 70 has been attached, in a mold 80 as illustrated in FIGS. 17 and 18, for example (step S4 in FIG. 5). As in the first embodiment, these components, etc. of the semiconductor device 10 are set in the mold 80.

The mold 80 according to the second embodiment includes the inlet 84*g*, a gate 85*g*, a plurality of control pins 87*f* and 87*g*, and pressing parts. The inlet 84*g* communicates with a cavity 83 and is formed in an area in the short side 80*d* of the cavity 83, the area being near a control lead frame 30. In addition, in FIG. 17, the inlet 84*g* is formed in one location of the short side 80*d*. Any number of inlets 84*g* and any size of the inlets 84*g* may be formed, as long as at least one inlet 84*g* is formed near a control lead frame 30 along the short side 80*d* of the cavity 83.

The gate 85*g* connects a runner, with which a pot including the molding resin raw material is provided, to the inlet 84*g*. The molding resin raw material flowing through the runner is injected into the cavity 83 through the gate 85*g* and the inlet 84*g*.

The control pins 87 each have the same shape as those according to the first embodiment and are formed in the top surface of an upper mold 81 of the mold 80. The control pins 87*g* and 87*f* are formed along the short side 80*d*. The control pins 87*f* and 87*g* are disposed near a control die pad 38*a*1 in plan view. Specifically, the control pins 87*f* and 87*g* are each disposed within an area from an outer edge portion of the control die pad 38*a*1 to a location away from the outer edge portion by the length of a control wire 22*a* or 22*b*.

In addition, the control pin 87*g* is disposed in the upper mold 81 between the inlet 84*g* and the plurality of control wires 22*a* and on a line connecting the inlet 84*g* and the plurality of control wires 22*a* in plan view.

The control pin 87*f* is disposed in the upper mold 81 between the plurality of control wires 22*b* and the short side 80*d* and on a line connecting the plurality of control wires 22*b* and the short side 80*d* in plan view. In particular, the control pin 87*f* is disposed between the control die pad 38*a*1 and the main die pad 47*a* in plan view. That is, the control pin 87*f* is disposed at a side portion of the control die pad 38*a*1 in the direction of the long side 80*a* and at a side portion of the main die pad 47*a* in the direction of the long side 80*c*.

In addition, the lower end of the control pin 87*g* is away from the control IC 50*h* and the electronic part 51*c* as illustrated in FIG. 18. In addition, a control wire 22*a* connects to the control IC 50*h* and the electronic part 51*c* while forming a loop. The lower end of the control pin 87*g* is located at a height corresponding to 30% to 80%, inclusive, of the height from the top of the loop of the control wire 22*a* to the connection points of the corresponding control IC 50*h* and the electronic part 51*c*.

The lower end of the control pin 87*f* is away from a semiconductor chip 21 as illustrated in FIG. 18. The lower end of the control pin 87*f* is located below the control die pad 38*a*1. In addition, the control wire 22*b* connects to the corresponding semiconductor chip 21 while forming a loop. The lower end of the control pin 87*f* is located at a height corresponding to 30% to 80%, inclusive, of the height from the top of the loop of the individual control wire 22*b* to the connection point of the corresponding semiconductor chip 21.

In this way, the plurality of main current lead frames 40 and the plurality of control lead frames 30 are set in the cavity 83 formed by a lower mold 82 and the upper mold 81 including the control pins 87*f* and 87*g*, etc.

In the second embodiment, too, in the above steps S1 to S4, the mounting step in step S3 may be performed before the attachment step in step S2. Alternatively, the attachment step in step S2 may be performed during the mounting step in step S3. In this case, after the soldering of the semiconductor chips 21 to 24, the control ICs 50*h* and 50*l*, and the electronic parts 51*a* to 51*c* in step S3, the attachment step in step S2 may be performed, and the remaining wiring in the mounting step in step S3 may be performed.

In addition, in the above steps S1 to S4, after the preparation step in step S1, the mounting step in step S3 may be performed without performing the attachment step in step S2. Next, the semi-cured insulating sheet 70 may be disposed in the lower mold 82, and the semiconductor chips 21 to 24, the control ICs 50*h* and 50*l*, and the electronic parts 51*a* to 51*c* may be disposed on the semi-cured insulating sheet 70. Next, the plurality of main current lead frames 40 and the plurality of control lead frames 30, which have been wired, may be disposed. Specifically, in the placement step in step S4, first, the insulating sheet 70 is disposed on the inner bottom surface of the lower mold 82 such that the rear surface of the insulating sheet 70 comes into contact with the inner bottom surface of the lower mold 82. Next, the main die pads are disposed on the front surface of the insulating sheet 70 such that the rear surfaces of the main die pads come into contact with the front surface of the insulating sheet 70. In this way, the attachment step in step S2 is simultaneously performed in the placement step in step S4.

Next, a molding step of injecting the liquid molding resin raw material 62 into the mold 80 is performed (step S5 in FIG. 5). In this step, too, as in the first embodiment, the semi-cured insulating sheet 70 is pressed in the direction of the inner bottom surface of the lower mold 82 by using the plurality of pressing parts, and this state is maintained.

Next, a tablet semi-cured (stage B) molding resin raw material 62 is set in the pot of a molding apparatus. Next, this molding resin raw material 62 is heated and softened. Pressure is applied to the softened semi-cured molding resin raw material, which is next injected into the cavity 83 from the gate 85*g*. The upper mold 81 and the lower mold 82 are heated in advance, and the cavity 83 is filled with the softened semi-cured molding resin raw material 62.

Next, the injection of the softened semi-cured molding resin raw material 62 into the cavity 83 will be described in detail. When the molding resin raw material 62 inside the pot (not illustrated) is pressed, the molding resin raw material 62 flows out of the runner communicating with the pot and flows into the gate 85*g*. The semi-cured molding resin raw material 62 flowing through the gate 85*g* is injected into the cavity 83 from the single inlet 84*g*. The molding resin raw material 62 is injected perpendicularly (−X direction) to the short side 80*d* from the inlet 84*g*. In addition, a certain amount of the molding resin raw material 62 is injected from the inlet 84*g* per unit time. Thus, in plan view, the molding resin raw material 62 spreads inside the cavity 83 from the inlet 84*g* to the control die pad 38*a*1.

In this case, too, as in the first embodiment, the flow velocity of the molding resin raw material 62 drops in areas near the inner top surface (the inner top surface of the upper mold 81) and the inner bottom surface (the inner bottom surface of the lower mold 82) of the mold 80 due to the shear stress. On the other hand, in areas (center parts) away from the upper mold 81 and the lower mold 82, the flow velocity of the molding resin raw material 62 rises. Thus, the molding resin raw material 62 flows to the control wires 22*a* and 22*b* at fast flow velocity.

The control pin 87*g* is disposed in an area between the short side 80*d* and a control wire 22*a*, the area being near the control wire 22*a*. The control pin 87*f* is disposed in an area between the short side 80*d* and a control wire 22*b*, the area being near the control wire 22*b*. Thus, the flow of the molding resin raw material 62 is divided into two directions (±Y directions) by each of the control pins 87*g* and 87*f*. As a result, as illustrated in FIGS. 19 and 20, the flow velocity of the molding resin raw material 62 on the rear side of each of the control pins 87*g* and 87*f* (in the direction of the short side 80*b*) is dropped. Thus, it is possible to prevent the molding resin raw material 62 from deforming the control wires 22*a* and 22*b* and peeling off the control wires 22*a* and 22*b* at their respective bonding locations. In addition, occurrence of damage to the control wires 22*c* and 22*d* is also prevented. In this way, as in the first embodiment, the cavity 83 is filled with the molding resin raw material 62. Subsequently, by performing the same steps as those in the first embodiment, the semiconductor device 10 is obtained.

Thus, according to the second embodiment, as in the first embodiment, the flow velocity of the molding resin raw material 62 flowing toward the control wires 22*a* and 22*b* is reduced. Thus, it is possible to prevent the deformation of the control wires 22*c* and 22*b* and the peeling off the control wires 22*c* and 22*b* from their respective wiring targets. Thus, deterioration of the reliability of the semiconductor device 10 is prevented.

The technique discussed above prevents injected sealing material from deforming wires and prevents deterioration of the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device manufacturing method, comprising:
   preparing
      a molding resin raw material,
      a mold having a rectangular shape in a plan view of the semiconductor device and including a storage space surrounded by a first long side, a first short side, a second long side, and a second short side in this order and an inlet for the molding resin raw material to be injected into the mold along the first long side or the second short side,
      a lead frame including a main die pad, a main current terminal integrally connected to the main die pad and extending in a first direction toward the first long side, a first control die pad disposed closer to the second long side than is the main die pad, a control terminal integrally connected to the first control die pad and extending in a second direction opposite to the first direction toward the second long side, and a second control die pad disposed closer to the second long side than is the first control die pad,
      a semiconductor chip including a control electrode on a front surface thereof, and
      a control element having a first front surface electrode on a front surface thereof;
   mounting the semiconductor chip on the main die pad and the control element on the first control die pad;
   connecting by wire the control electrode of the semiconductor chip to the first front surface electrode of the control element and/or the control terminal of the lead frame to the first front surface electrode of the control element;
   after the mounting and before or after the connecting by wire, placing the lead frame in the mold such that the semiconductor chip and the control element are stored in the storage space; and sealing the semiconductor chip and the control element on the lead frame with the molding resin raw material by disposing a control pin between the inlet and the wire and on a line connecting the inlet and the wire in the plan view, injecting the molding resin raw material from the inlet into the storage space, a flow of the molding resin raw material being controlled by the control pin, and filling the storage space with the molding resin raw material.

2. The semiconductor device manufacturing method according to claim 1, wherein main surfaces of the first control die pad and the second control die pad are located higher than a front surface of the main die pad in a height direction orthogonal to the front surface of the main die pad.

3. The semiconductor device manufacturing method according to claim 1, wherein
the wire directly connects to each other at least the control electrode and the first front surface electrode, and
the control pin has a column shape extending in a height direction orthogonal to the front surface of the main die pad and has a lower end and an upper end opposite to each other, and the sealing includes disposing the lower end of the control pin away from the main die pad and the semiconductor chip.

4. The semiconductor device manufacturing method according to claim 1, wherein
the inlet is provided in plurality along the first long side,
the main die pad is provided in plurality along the first long side,
the semiconductor chip is provided in plurality, and each semiconductor chip of the plurality of semiconductor chips is disposed on a corresponding one of the main die pads of the plurality of main die pads,
the wire comprises a plurality of wires, and each wire of the plurality of wires connects the first front surface electrode of the control element and a corresponding one of the control electrodes of the plurality of semiconductor chips, and
the sealing includes disposing the control pin in an area between two adjacent main die pads among the plurality of main die pads that are adjacent to each other in the plan view.

5. The semiconductor device manufacturing method according to claim 4, wherein the sealing includes disposing the control pin between two adjacent semiconductor chips on the two adjacent main die pads in the plan view.

6. The semiconductor device manufacturing method according to claim 5, wherein, in a side view in which the control element is seen from the first long side, the plurality of wires, each of which connects the first front surface electrode and the corresponding one of the control electrodes, includes a first wire extending over a gap between the two adjacent main die pads that are adjacent to each other.

7. The semiconductor device manufacturing method according to claim 6, wherein
main surfaces of the first control die pad and the second control die pad are located higher, in a height direction orthogonal to the front surface of the main die pad, than are the front surfaces of the main die pads, and
the control pin has a column shape extending in a height direction orthogonal to the front surface of the main die pad and has a lower end and an upper end opposite to each other, and
in the side view, the lower end of the control pin is located lower than are the main surfaces of the first control die pad and the second control die pad.

8. The semiconductor device manufacturing method according to claim 6, wherein
the first wire has a loop shape, and has a wire height that is a length between a highest point in the loop shape and one of ends that closer to a bottom of the semiconductor device than is an other end, and
the control pin has a column shape extending in a height direction orthogonal to the front surface of the main die pad and has a lower end and an upper end opposite to each other, and
in the side view, the lower end of the control pin is located at a certain distance below the highest point in the loop shape of the first wire, the certain distance corresponding to a length in a range of 30% to 80% of the wire height.

9. The semiconductor device manufacturing method according to claim 1, wherein
the inlet is provided in plurality, and the plurality of inlets is provided along the second short side and closer to the second long side than is the first long side,
the preparing includes further preparing an electronic part having a second front surface electrode on a front surface thereof,
the mounting further includes mounting the electronic part on the second control die pad,
the wiring includes wiring to directly connect between the first front surface electrode of the control element and the control electrode of the semiconductor chip, directly connect between the first front surface electrode of the control element and the control terminal of the lead frame, or directly connect between the first front surface electrode of the control element and the second front surface electrode of the electronic part via the wire, and
the sealing further includes disposing the control pin near the first control die pad in the plan view.

10. The semiconductor device manufacturing method according to claim 9, wherein
the wiring includes wiring to directly connect between the first front surface electrode and the control terminal, and directly connect between the first front surface electrode and the second front surface electrode via wires, and
the sealing further includes disposing the control pin between the first control die pad and the second control die pad in a side view in which the control element is seen from the second short side.

11. The semiconductor device manufacturing method according to claim 10, wherein
the control pin has a column shape extending in a height direction orthogonal to the front surface of the main die pad and has a lower end and an upper end opposite to each other, and
the sealing includes disposing the lower end of the control pin away from the control element and the electronic part.

12. The semiconductor device manufacturing method according to claim 11, wherein
the wires each have a loop shape, each of the wires having a wire height that is a length between a highest point in the loop shape and one of ends closer to a bottom of the semiconductor device than is an other end, and
in the side view, the lower end of the control pin is located at a certain distance below the highest point in the loop shape of a closest wire, the certain distance corresponding to a length in a range of 30% to 80% of the wire height.

13. The semiconductor device manufacturing method according to claim 9, wherein
the wiring includes wiring to directly connect between the first front surface electrode and the control terminal via the wire, and
the sealing includes disposing the control pin between the first control die pad and the main die pad in a side view in which the control element is seen from the second short side.

14. The semiconductor device manufacturing method according to claim 13, wherein
the control pin has a column shape extending in a height direction orthogonal to the front surface of the main die pad and has a lower end and an upper end opposite to each other, and
the sealing includes disposing the lower end of the control pin below the first control die pad and the second control die pad and away from the semiconductor chip.

15. The semiconductor device manufacturing method according to claim 14, wherein
the wire has a loop shape, and has a wire height that is a length between a highest point in the loop shape and one of ends closer to a bottom of the semiconductor device than is an other end, and
in the side view, the lower end of the control pin is located at a certain distance below the highest point in the loop shape of the wire, the certain distance corresponding to a length in a range of 30% to 80% of the wire height.

16. The semiconductor device manufacturing method according to claim 1, wherein
a cross section of the control pin has a polygonal shape, the cross section being parallel to a front surface of the lead frame, and
the sealing includes disposing the control pin such that any one of the vertexes of the cross section faces, in the plan view, the first long side or the second short side in which the inlet provided in plurality is formed.

* * * * *